United States Patent
Ohe et al.

(10) Patent No.: US 6,769,821 B2
(45) Date of Patent: Aug. 3, 2004

(54) OPTICAL TRANSMITTER-RECEIVER MODULE AND ELECTRONIC DEVICE USING THE SAME

(75) Inventors: Nobuyuki Ohe, Nara-ken (JP); Kazuhito Nagura, Kashihara (JP); Motoki Sone, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 56 days.

(21) Appl. No.: 10/305,029

(22) Filed: Nov. 27, 2002

(65) Prior Publication Data

US 2003/0113119 A1 Jun. 19, 2003

(30) Foreign Application Priority Data

Nov. 30, 2001 (JP) .................................... P 2001-367664

(51) Int. Cl.⁷ ................................................ G02B 6/36
(52) U.S. Cl. ........................... 385/92; 385/88; 398/139
(58) Field of Search .............................. 385/88, 89, 92, 385/93, 59, 76, 78, 43; 398/135, 138, 139, 163; 359/152, 163

(56) References Cited

U.S. PATENT DOCUMENTS

| 5,546,212 A | * | 8/1996 | Kunikane et al. | ........... 398/139 |
| 5,555,334 A | * | 9/1996 | Ohnishi et al. | ............... 385/93 |
| 6,188,495 B1 | * | 2/2001 | Inoue et al. | ................. 398/139 |
| 6,351,584 B1 | * | 2/2002 | Horie et al. | ................... 385/31 |
| 6,454,467 B1 | * | 9/2002 | Ishihara et al. | ............... 385/88 |
| 6,694,074 B2 | * | 2/2004 | Schunk | ......................... 385/88 |
| 2003/0002822 A1 | * | 1/2003 | Ishihara et al. | ............... 385/88 |
| 2003/0016920 A1 | * | 1/2003 | Sohmura et al. | .............. 385/88 |
| 2003/0169979 A1 | * | 9/2003 | Fujita et al. | .................. 385/89 |
| 2003/0215234 A1 | * | 11/2003 | Mine et al. | ................. 398/139 |

FOREIGN PATENT DOCUMENTS

| JP | 2001-116961 A | 4/2001 |
| JP | 2001-147349 A | 5/2001 |

* cited by examiner

*Primary Examiner*—John R. Lee
*Assistant Examiner*—James P. Hughes
(74) *Attorney, Agent, or Firm*—Birch, Stewart, Kolasch & Birch, LLP

(57) ABSTRACT

In an optical transmitter-receiver module for performing optical transmission and reception by using a single-core optical fiber, a light-tight partition plate unit 506 for separation between an optical path of a transmission signal light and an optical path of a reception signal light is held between a jack section 508 for detachably holding an optical plug 240 and a light emitting/receiving unit 505 which has an LED 514 and a PD 515 positioned and fixed in place and molded in one piece. The LED 514 is located at a larger a distance in a direction of optical axis from the optical fiber than the PD 515 is. The partition plate unit 506 is urged toward the optical fiber by springs.

9 Claims, 27 Drawing Sheets

*Fig. 14A*  *Fig. 14B*
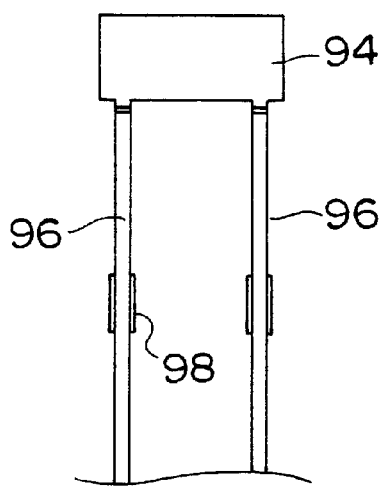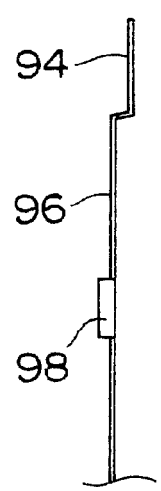
*Fig. 15A*  *Fig. 15B*  *Fig. 15C*
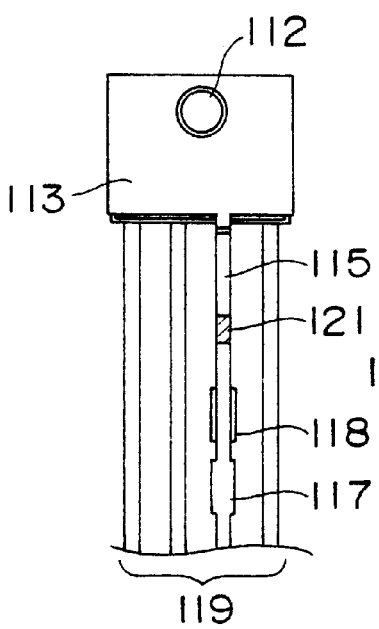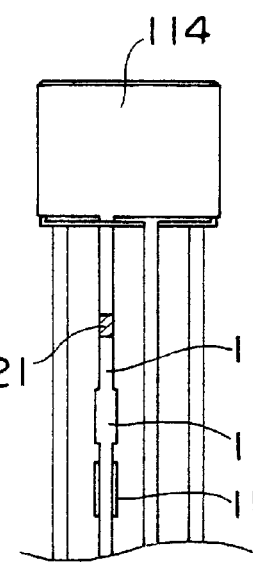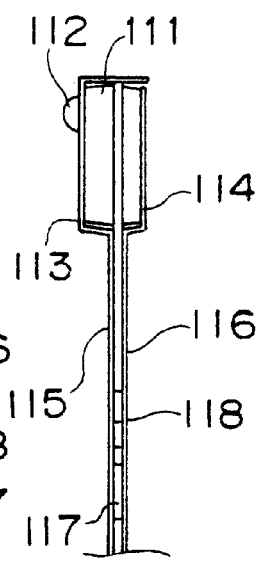

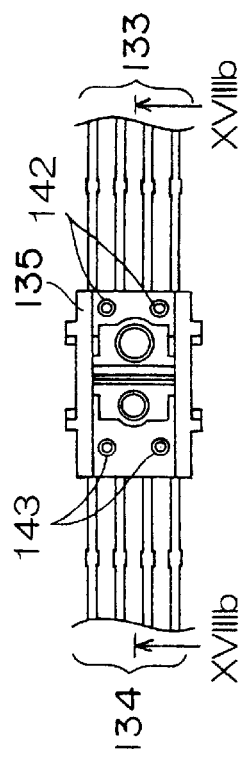
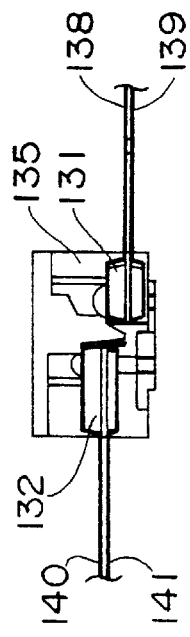
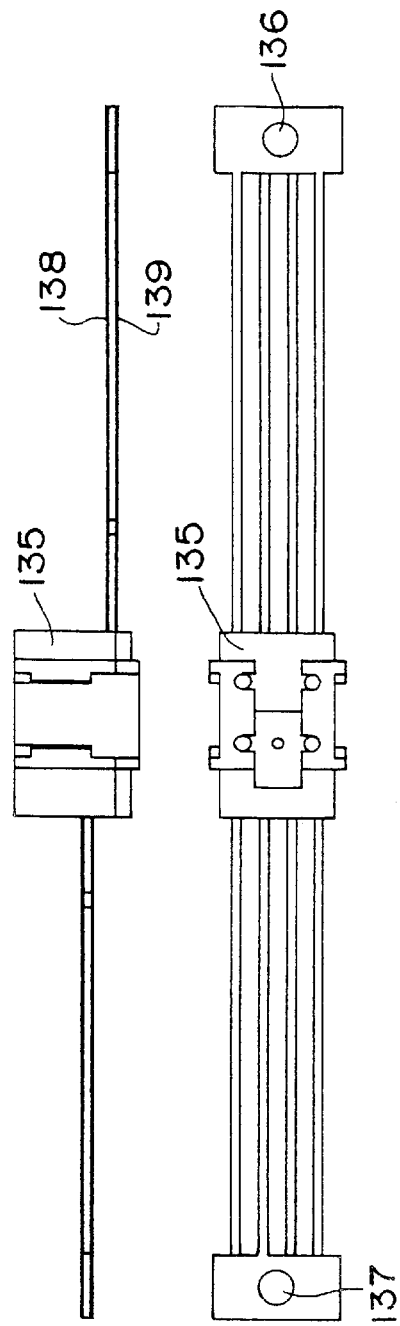
Fig.18A
Fig.18B
Fig.18C
Fig.18D

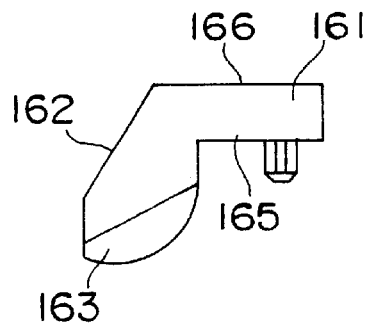
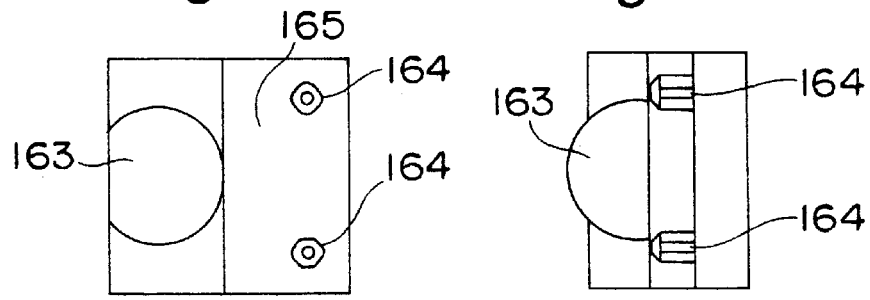
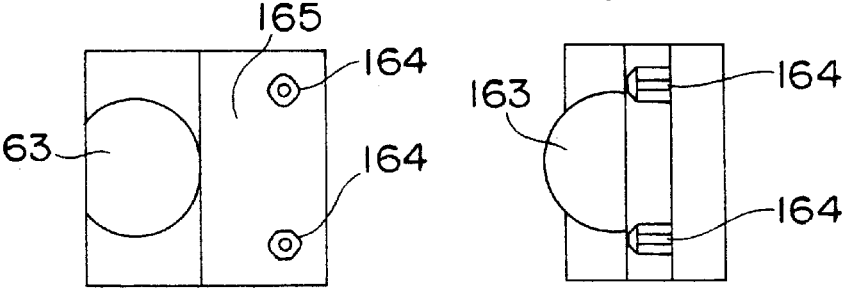
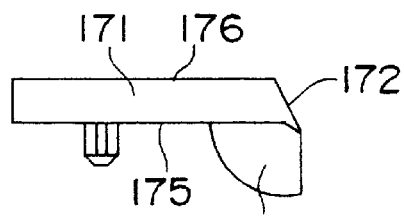
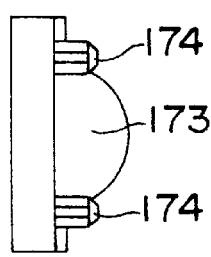
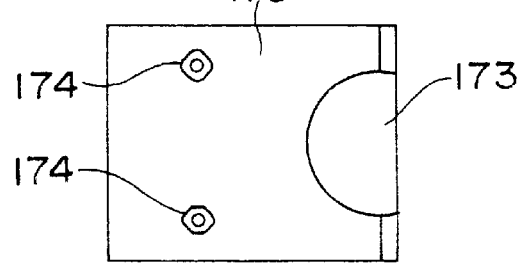

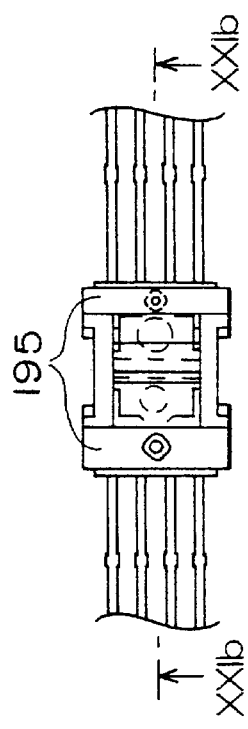
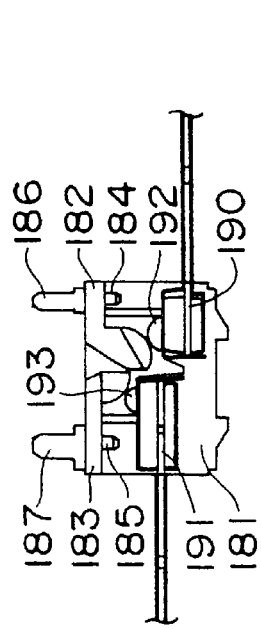
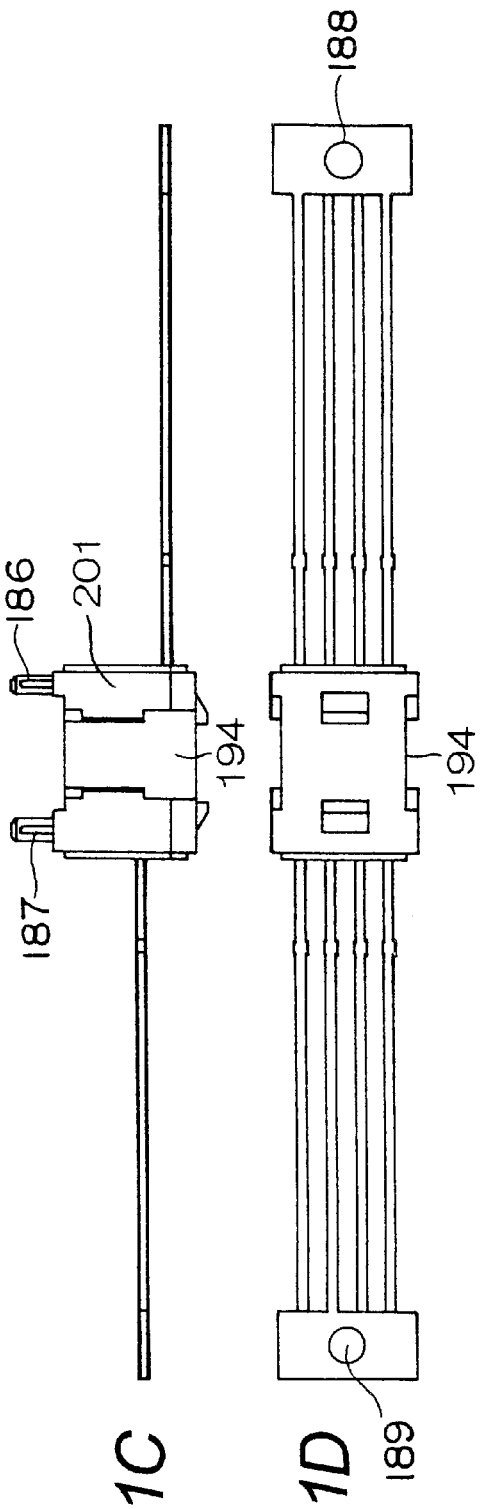
Fig.21A
Fig.21B
Fig.21C
Fig.21D

OPTICAL TRANSMITTER-RECEIVER MODULE AND ELECTRONIC DEVICE USING THE SAME

BACKGROUND OF THE INVENTION

The present invention relates to an optical transmitter-receiver module and an electronic device for use in a single-core bidirectional optical transmitter-receiver system capable of performing transmission and reception with a single-core optical fiber. The present invention relates, in particular, to a digital communication system, which is able to perform high-speed transmission, such as IEEE1394 (Institute of Electrical and Electronic Engineers 1394) and USB (Universal Serial Bus) 2.0.

Conventionally, as a first optical transmitter-receiver module, there is a one as described in Japanese Patent Laid-Open Publication No. 2001-116961. In this optical transmitter-receiver module, full-duplex communications are achieved by reducing electric crosstalk by employing a shield plate while reducing optical crosstalk by employing a light-tight partition plate that abuts against the end surface of the optical fiber so as to separate the light-emitting device and the light-receiving device from each other.

FIG. 35A and FIG. 36A are plan views of a partition plate 1019, while FIG. 35B and FIG. 36B are side views showing the positional relationship of the partition plate 1019 with respect to an optical plug 1030. With regard to this first optical transmitter-receiver module, FIGS. 35A and 35B shows a state in which the optical plug 1030 provided internally with a single-core optical fiber 1032 is partway inserted in an optical transmitter-receiver module (overall view is not shown) and starts coming in contact with the partition plate 1019. FIGS. 36A and 36B show a state in which the optical plug 1030 is completely inserted in the optical transmitter-receiver module and fully put in contact with the partition plate 1019.

FIG. 37A shows a side view of an essential part of an optical cable, which has the plug 1030 and constitutes an optical transmitter-receiver system with the aforementioned optical transmitter-receiver module, while FIG. 37B shows a rear view of the optical cable that has the optical plug 1030. As shown in FIGS. 37A and 37B, the optical plug 1030 (including the optical fiber) is provided at each end portion (only one end portion is shown) of the optical cable, and a front end of the optical plug 1030, which includes a tip of the optical fiber, has an inclined surface 1030a inclined forward in the lengthwise direction of the optical fiber (i.e., toward the other optical transmitter-receiver module side not shown). Moreover, the optical plug 1030 is provided with a anti-rotation key 1031 extended in the horizontal direction, and the optical transmitter-receiver module is internally provided with a keyway (not shown) that cooperates with the key 1031, for preventing possible changes in the optical input and characteristics in accordance with the rotation of the optical plug 1030.

Moreover, as a second conventional optical transmitter-receiver module, there is a one as described in Japanese Patent Laid-Open Publication No. 2001-147349. As shown in FIG. 38, this second optical transmitter-receiver module employs a partition plate 1111 similar to that of the aforementioned first conventional optical transmitter-receiver module that has an optical system employing a Foucault prism 1104. According to this, in the second optical transmitter-receiver module, the end surface of the optical fiber 1102 of the optical plug 1101 abuts against the partition plate 1111, and a light-emitting element 1103 and a light-receiving element 1105 are molded or encapsulated with a molding resin 1106. Lens portions 1106a and 1106b are integrally formed in the plastic molding stage of the molding resin.

In the aforementioned first conventional optical transmitter-receiver module, the optical plug 1030 has the anti-rotation key 1031. Therefore, the optical plug 1030 cannot be inserted into the optical transmitter-receiver module unless the key 1031 is aligned with the keyway of the optical transmitter-receiver module when fitting the optical plug 1030, and this disadvantageously causes inconvenience to the user. However, if the anti-rotation key 1031 of the optical plug 1030 is removed to improve the convenience at the time of insertion of the optical plug, then the optical plug 1030 becomes rotatable. Therefore, if the optical plug 1030 rotates with an optical fiber end surface 1030a being in contact with the partition plate 1019, then there occurs a problem that the inclined end surface 1030a of the optical fiber and/or the partition plate 1019 is damaged.

Moreover, the second conventional optical transmitter-receiver module, which employs the Foucault prism optical system having the partition plate 1111 similar to that of the first conventional optical transmitter-receiver module, has the structure in which the partition plate 1111 abuts against the end surface of the optical fiber 1102. Therefore, similarly to the first conventional optical transmitter-receiver module, there occurs a problem that the end surface of the optical fiber 1102 and/or the partition plate 1111 is damaged. Furthermore, the light-emitting element 1103 and the light-receiving element 1105 are mounted on an identical substrate 1109 in this second optical transmitter-receiver module, but the optical positions of the light-emitting element 1103 and the light-receiving element 1105 are not optimized with regard to the optical system that has the partition plate 1111.

SUMMARY OF THE INVENTION

Accordingly, an object of this invention is to provide an optical transmitter-receiver module and an electronic device using the same, which module is able to perform high-quality optical transmission by full-duplex communication scheme by using a light-tight partition plate and able to prevent the optical fiber end surface and the partition plate from being damaged even if the inserted optical plug is rotated in the module.

In order to accomplish the above object, the present invention provides an optical transmitter-receiver module having a light-emitting element for emitting transmission signal light and a light-receiving element for receiving reception signal light, said module being able to perform both transmission of the transmission signal light and reception of the reception signal light by means of a single-core optical fiber, said module comprising:

a jack section for detachably holding an optical plug provided at an end portion of the optical fiber;

a light emitting/receiving unit having the light-emitting element and light-receiving element positioned and fixed in place and molded in one piece; and a light-tight partition plate unit for separating an optical path of the transmission signal light and an optical path of the reception signal light from each other, said light-tight partition plate being arranged so as to be held between the jack section and the light emitting/receiving unit, the light-tight partition plate unit having spring means for urging this unit toward the optical fiber.

According to the optical transmitter-receiver module of the above construction, by arranging the light-tight partition plate unit for separation between the optical path of the transmission signal light and the optical path of the reception signal light so that the plate is held between the jack section and the light emitting/receiving unit, the coupling of the transmission signal light directly with the light-receiving element is restrained, so that high-quality optical transmission by the full-duplex communication method is achieved. Further, because the partition plate unit is always urged toward the optical fiber by the spring means, the positional relation between the end surface of the optical plug and the partition plate unit is kept constant. Therefore, high-quality optical transmission by the full-duplex communication scheme can be performed, and the optical fiber end surface and the partition plate are prevented from being damaged even if the inserted optical plug is rotated in the module.

In one embodiment, the partition plate unit has a partition plate for separating an optical path of the transmission signal light and an optical path of the reception signal light from each other, a resin-molded piece having an engagement surface with which an end surface of the optical plug comes in contact when inserted in the jack section, and the spring means urging the engagement surface of the resin-molded piece toward the optical plug. Also, the module further comprises a retaining portion for retaining the partition plate unit movably in a direction of optical axis of the optical fiber.

In this embodiment, the partition plate unit, in which the partition plate, the resin-molded piece and the spring means are unitized with one another, is retained movably in the direction of the optical axis of the optical fiber by the retaining portion. Therefore, even if variations occur in the length in the direction of the optical axis of the optical fiber of the optical plug, the partition plate unit is moved by the spring means so that the positional relation between the end surface of the optical plug and the partition plate becomes constant.

In one embodiment, the spring means of the partition plate unit are provided in at least two places located on a plane approximately perpendicular to the optical axis of the fiber and on a diagonal line of the resin molding.

With this arrangement, the partition plate unit can stably be moved by being urged in the direction of the optical axis of the optical fiber by a necessary minimum number of spring means without being inclined, and the reduction in size and the simplification of the partition plate unit can be achieved.

In one embodiment, the partition plate and resin-molded piece of the partition plate unit are formed into one piece by insert molding.

This arrangement enables an easy assembling of the module, in comparison with a case of combining small separate members, which leads to a difficult assembling. Also, the required dimensional accuracy can easily be obtained so that high-quality optical transmission by the full-duplex communication method can be achieved. In addition, the partition plate unit can be downsized.

In one embodiment, the partition plate of the partition plate unit has a planar opposed surface that faces an end surface of the optical fiber with a gap therebetween when the optical plug is placed in position within the module.

With this arrangement, dimensional accuracy of the planar opposed surface with respect to the optical fiber end surface can easily be obtained. Also, the partition plate having the planar surface can be processed at lower cost than when having a curved opposed surface.

In one embodiment, an optical absorption layer is provided on the opposite surface of the partition plate.

With this arrangement, the signal light emitted from the end surface of the optical fiber is prevented from being reflected by the opposed surface of the partition plate, to which the emitted signal light first gets.

In one embodiment, the engagement surface of the resin-molded piece comes in contact with a peripheral edge portion of the end surface of the optical plug. Therefore, the positional adjustment of the end surface of the optical plug can easily be achieved without damaging the optical fiber end surface.

In one embodiment, the partition plate is sized such that a distance in a direction of optical axis from said end surface of the optical fiber to an end opposite from the optical fiber of the partition plate is greater than distances in a direction of optical axis from said end surface of the optical fiber to each of a bottom of a transmission lens provided on emission side of the light-emitting element and a bottom of a reception lens provided on incident side of the light-receiving element.

With this arrangement, the transmission signal light (including reflection light) emitted from the light-emitting element is reliably prevented from being incident on the light-receiving element, so that the optical crosstalk can effectively be reduced.

By employing the above-mentioned optical transmitter-receiver module, there can be provided electronic equipment such as an information domestic appliance capable of performing optical transmission by a high-quality full-duplex communication system.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 14A is a front view of the lower shield plate, and FIG. 14B is a side view of the lower shield plate;

FIG. 15A is a front view of a light-receiving device on which an upper shield plate and a lower shield plate are mounted, FIG. 15B is a rear view of the above light-receiving device, and FIG. 15C is a side view of the light-receiving device of FIG. 15A as viewed from the right-hand side;

FIG. 18A is a front view of a light emitting/receiving unit integrated by secondary injection resin molding, FIG. 18B is a sectional view taken along line XVIIIb—XVIIIb of FIG. 18A, FIG. 18C is a side view of the above light emitting/receiving unit, and FIG. 18D is a rear view of the above light emitting/receiving unit;

FIG. 19A is a front view of a transmission prism lens, FIG. 19B is a view seen from the upper side of the transmission prism lens of FIG. 19A, and FIG. 19C is a side view seen from the right-hand side of the transmission prism lens of FIG. 19A;

FIG. 20A is a front view of a reception prism lens, FIG. 20B is a view seen from the upper side of the reception prism lens of FIG. 20A, and FIG. 20C is a side view seen from the right-hand side of the reception prism lens of FIG. 20A;

FIG. 21A is a front view of a light emitting/receiving unit in which the above transmission prism lens and the reception prism lens are inserted, FIG. 21B is a sectional view taken along line XXIb—XXIb of FIG. 21A, FIG. 21C is a side view of the light emitting/receiving unit, and FIG. 21D is a rear view of the light emitting/receiving unit;

DETAILED DESCRIPTION OF THE PREFERRED EMBODIMENTS

Figure 1:
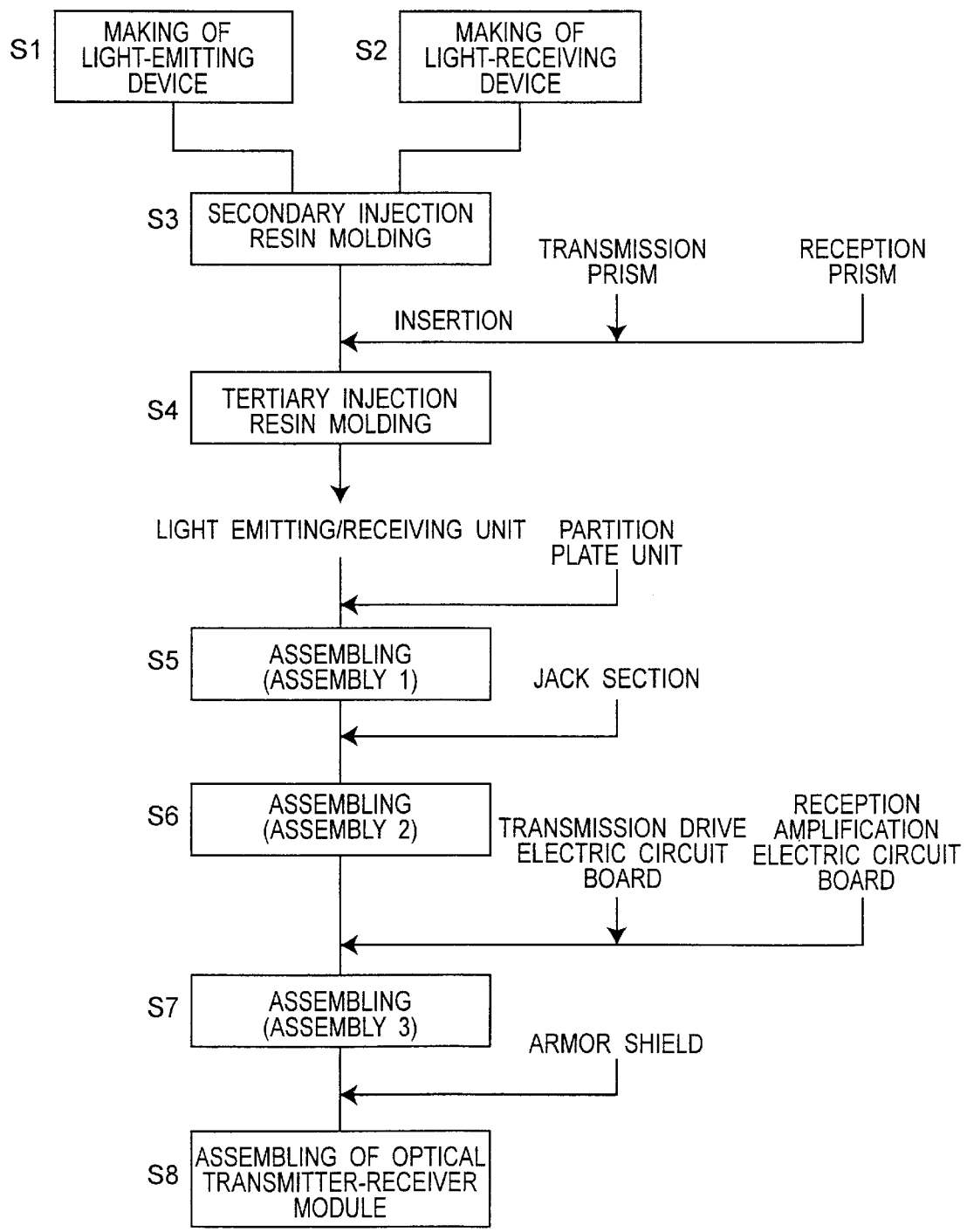
FIG. 1 is a flowchart showing the manufacturing method of an optical transmitter-receiver module according to one embodiment of this invention.

The optical transmitter-receiver module and electronic equipment of this invention will be described in detail below on the basis of the embodiments thereof shown in the drawings.

In explaining an embodiment of this invention, the outline of a method of manufacturing the optical transmitter-receiver module of this invention will be first described, and the construction of the optical transmitter-receiver module and the details of the manufacturing method will be subsequently described.

FIG. 1 is a flowchart showing the manufacturing method for the optical transmitter-receiver module of this embodiment. The optical transmitter-receiver module of this embodiment is manufactured according to the flowchart of FIG. 1.

First, in step S1, a light-emitting device is manufactured by encapsulating a light-emitting element by transfer molding.

Next, in step S2, a light-receiving device is manufactured by encapsulating a light-receiving element by transfer molding.

Next, in step S3, the light-emitting device and the light-receiving device are integrated with each other by being subjected to secondary injection resin molding for positioning and fixation of the devices.

Next, in step S4, a light emitting/receiving unit is formed by inserting a transmission prism lens as an optical element and a reception prism lens as an optical element to combine the lenses with the integrated devices by tertiary injection resin molding.

Next, in step S5, an assembly 1 is manufactured by combining the light emitting/receiving unit with a partition plate unit.

Next, in step S6, an assembly 2 is manufactured by combining the assembly 1 with a jack section having a plug insertion hole and an engagement retaining portion for enabling the attaching and detaching of an optical fiber cable provided with an optical plug for optical signal transmission.

Next, in step S7, an assembly 3 is manufactured by combining the assembly 2 with a transmission drive electric circuit board as a light-emitting element drive circuit board and a reception amplification electric circuit board as a light-receiving element processing circuit board.

Further, in step S8, an optical transmitter-receiver module is manufactured by combining the assembly 3 with an armor shield.

Figure 2:
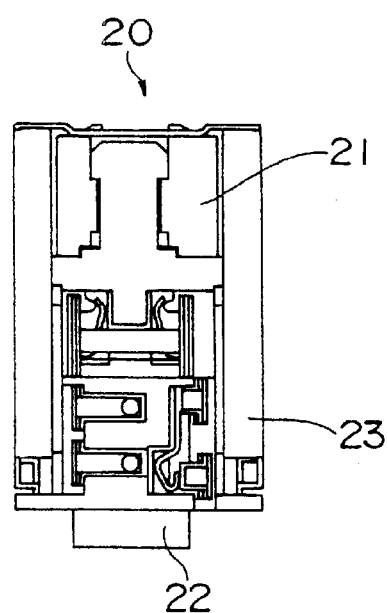
FIG. 2 is a top view of the above optical transmitter-receiver module.
Figure 3:
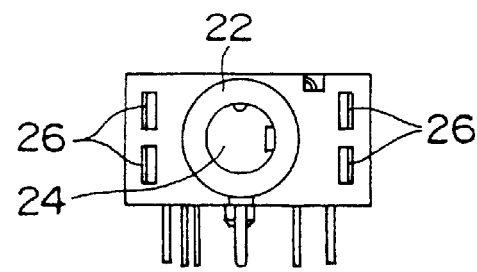
FIG. 3 is a view of the above optical transmitter-receiver module seen from the direction of a plug insertion hole.
Figure 4:
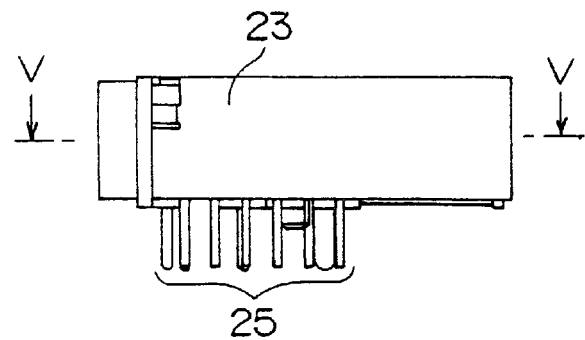
FIG. 4 is a side view of the above optical transmitter-receiver module.

FIGS. 2 through 4 show the external views of the optical transmitter-receiver module of the embodiment. FIG. 2 is a top view of the optical transmitter-receiver module. FIG. 3 is a view of the optical transmitter-receiver module seen from the direction of the plug insertion hole. FIG. 4 is a side view of the optical transmitter-receiver module. In FIGS. 2 through 4 are shown a light emitting/receiving unit 21, a jack section 22, an armor shield 23, a plug insertion hole 24, external input/output terminals 25 and rectangular holes 26 for retaining shield plates.

Figure 6:
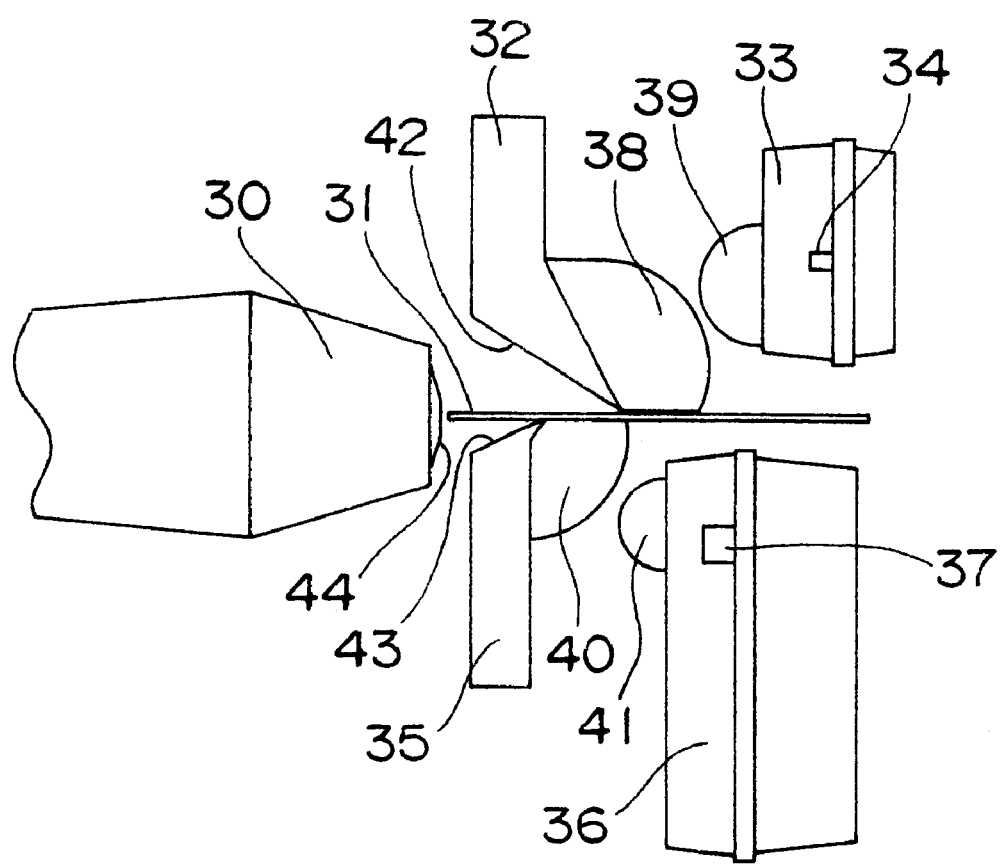
FIG. 6 is an enlarged sectional view showing an optical system in the above optical transmitter-receiver module.

FIG. 6 is an enlarged sectional view showing an optical system in the optical transmitter-receiver module. The optical system arrangement of the optical transmitter-receiver module of this embodiment will be described first. In the embodiment, a light-emitting diode (hereinafter referred to as an LED) 34 is employed as a light-emitting element, and a photodiode (hereinafter referred to as a PD) 37 is employed as a light-receiving element.

As shown in FIG. 6, a partition plate 31 is arranged in front of an optical plug 30 that includes an optical fiber 44. A prism lens, which is an optical element, is divided into two parts of a transmission prism lens 32 and a reception prism lens 35, and the partition plate 31 is arranged in the boundary therebetween. This partition plate 31 has a thickness of 50 $\mu$m, and an interval between the transmission prism lens 32 and the reception prism lens 35 between which the partition plate 31 is inserted is set to 100 $\mu$m. The partition plate 31 is arranged in a center position (in a plane that includes the optical axis of the optical fiber) of the optical plug 30. The above arrangement is to set the projection area of the front end of the optical plug 30 at 50% on the transmission side and 50% on the reception side.

According to this embodiment, the LED 34 is encapsulated with a molding resin 33 by the transfer molding method or the like, and a transmission lens 39 is provided by the molding resin used at this time. Likewise, the PD 37 is encapsulated with a molding resin 36 by the transfer molding method or the like, and a reception lens 41 is provided by the molding resin used at this time. Transmission light from the LED 34 is collimated by a condenser lens 38 on the transmission prism lens 32 via the transmission lens 39, refracted by a prism portion 42 and thereafter coupled to an optical fiber 44. On the other hand, due to the partition plate 31, half the reception light emitted from the optical fiber 44 is refracted by the prism portion 43 of the reception prism lens 35, thereafter condensed by a condenser lens 40 and coupled with the reception PD 37 via the reception lens 41 of the molding resin 36. As described above, by inserting the partition plate 31, the transmission prism lens 32 and the reception prism lens 35 between the LED 34 and PD 37 and the optical fiber 44, it is enabled to perform transmission and reception, i.e., full-duplex communications by means of one optical fiber 44.

In this embodiment, the LED 34 is arranged in a position farther than the PD 37 with respect to the front ends of the optical plug 30 and the optical fiber 44. In this case, a difference between a distance from the optical plug 30 to the light-emitting surface of the LED 34 and a distance from the optical plug 30 to the light-receiving surface of the PD 37 is 1.3 mm. Further, the condenser lens 38 of the transmission prism 32 is arranged in a position farther than the condenser lens 40 of the reception prism lens 35 with respect to the front end of the optical plug 30. A difference between a distance from the front end of the optical fiber 44 to the condenser lens 38 and a distance from the front end of the optical fiber 44 to the condenser lens 40 is 1 mm. In this embodiment, the partition plate 31 is inserted between the light-emitting device in which the LED 34 is molded by transfer molding and the light-receiving device in which the PD 37 is molded by transfer molding. Therefore, it is impossible to arrange both the LED 34 and the PD 37 at a distance of less than 50 $\mu$m from the center position of the optical plug 30.

With regard to the optical system arrangement on the transmission side, the radiation light intensity of the LED 34 decreases with a peak at the center of the light-emitting portion as the angle increases, and the transmission efficiency becomes higher when the coupling of the light with the optical fiber of the optical plug 30 is attained with less bending of the ray of light at the prism portion 42 of the transmission prism lens 32. Therefore, the efficiency increases as the angle made between the light-emitting direction of the LED 34 and the direction of the optical axis of the optical fiber of the optical plug 30 decreases. For the above reasons, it may be conceivable to adopt a method of decreasing the angle between the LED 34 and the optical plug 30 by putting the LED 34 away from the front end of the optical plug 30. However, for the sake of downsizing the optical transmitter-receiver module, to place the LED 34 and the PD 37 away from the optical plug 30 becomes a negative factor due to the increase in size of the optical system. For the above reasons, in this embodiment, the LED 34 is arranged so that the distance from the front end of the optical plug 30 to the light-emitting portion of the LED 34 is about 4.75 mm. In this case, it is difficult to make the light emitted from the LED 34 wholly become parallel light by the transmission lens 39. Therefore, it is desirable to reduce the interval between the transmission lens 39 integrally molded by transfer molding and the condenser lens 38 of the transmission prism lens 32, thereby making fast incidence of light on the condenser lens 38. In this embodiment, the interval between the transmission lens 39 and the condenser lens 38 is set at 50 $\mu$m.

On the other hand, with regard to the optical system arrangement on the reception side, because the front end of the optical fiber of the optical plug 30 has a spherical surface, and therefore, the light emitted from the front end of the optical fiber tends to be concentrated toward the center, the reception efficiency is increased by arranging the prism portion 43 of the reception prism lens 35 in a position near the front end of the optical fiber so that the light is bent toward the reception side by the prism portion 43 of the reception prism lens 35 before the light strikes the partition plate 31, and then collimated by means of the condenser lens 40 of the reception prism lens 35 for the coupling with the PD 37 through the reception lens 41.

For the above reasons, the LED 34 is arranged in the position farther than the PD 37 with respect to the front end of the optical plug 30. Furthermore, the condenser lens 38 of the transmission prism 32 is also arranged in the position farther than the condenser lens 40 of the reception prism lens 35 with respect to the front end of the optical plug.

As described above, the optical positions of the LED 34 and the PD 37 are optimized. According to the optical simulation results of the optical system arrangement of this embodiment, the transmission efficiency of this optical system was 21.3%, and the reception efficiency was 31.2%, meaning that high transmission efficiency and reception efficiency were obtained.

The process steps of manufacturing the optical transmitter-receiver module of this embodiment will be described below.

Figure 7:
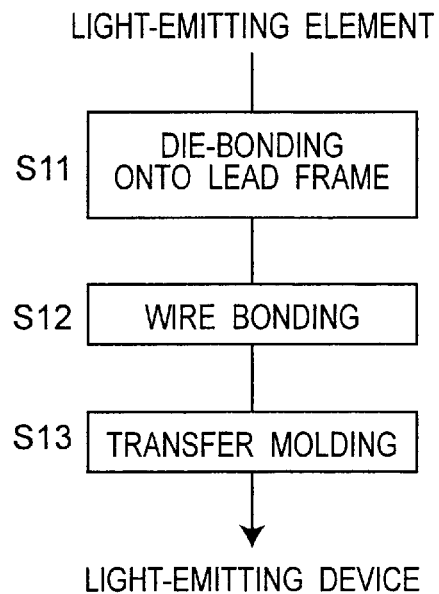
FIG. 7 is a flowchart for explaining the manufacturing process steps for a light-emitting device.
Figures 9A, 9B:
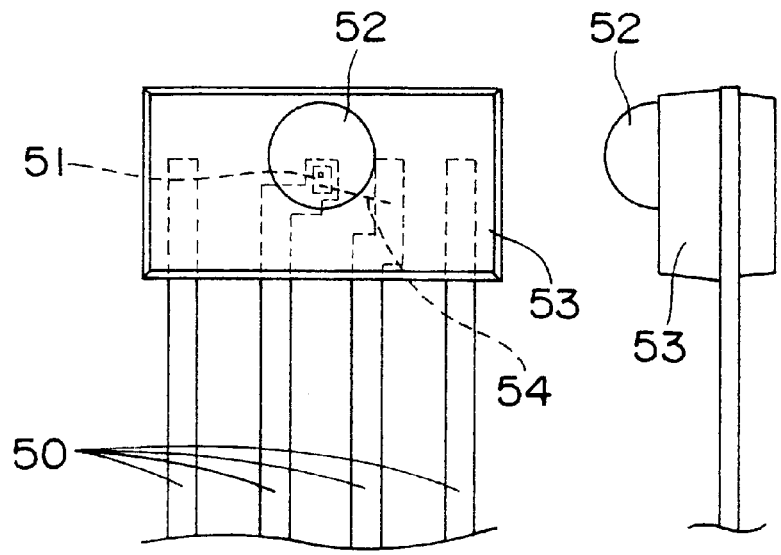
FIG. 9A is a top view of the above light-emitting device.
FIG. 9B is a side view of the above light-emitting device.

FIG. 7 is a flowchart for explaining the process steps of manufacturing a light-emitting device. FIG. 9A shows a top view of the light-emitting device. FIG. 9B shows a side view of the light-emitting device. As the light-emitting device of this embodiment, an LED (light-emitting diode) 51 (shown in FIG. 9A) is employed.

First, in step S11, the LED 51 of the light-emitting element is die-bonded onto a lead frame 50 (shown in FIG. 9A) with silver paste, conductive resin, indium or the like. The lead frame 50 is formed by cutting or etching a metal plate, such as a copper plate or an iron plate, plated with silver. One electrical connection of the LED 51 is provided in a prescribed position on the lead frame 50 using the silver paste, conductive resin, indium or the like, whereby the LED is fixed.

Next, in step S12, the other electrical connection of the LED 51 is provided in a prescribed position on the lead frame 50 by wire bonding with a gold wire or an aluminum wire 54 (shown in FIG. 9A).

Subsequently, in step 13, the resulting assembly is set in a metal mold and encapsulated with a molding resin 53 (shown in FIGS. 9A and 9B) by transfer molding.

As the resin used in the process steps of manufacturing this light-emitting device, an epoxy-based transparent material is used. At this time, by integrally forming a lens portion 52 (shown in FIGS. 9A and 9B) that has a spherical or aspherical surface, using the molding resin, in a direction inclined with respect to the light-emitting element, the efficiency of coupling of the light-emitting element with the optical fiber during transmission can be improved.

Figure 8:
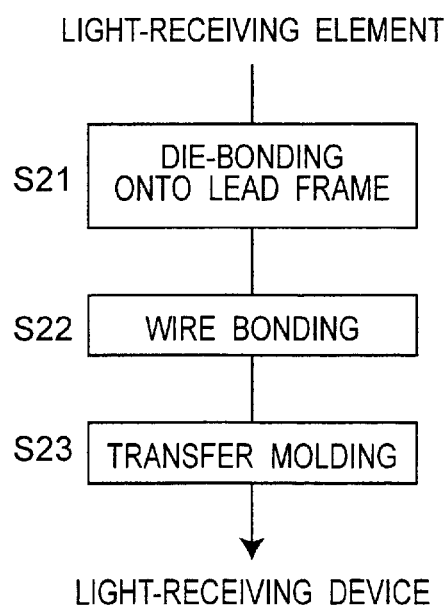
FIG. 8 is a flowchart for explaining the manufacturing process steps for a light-receiving device.
Figures 10A, 10B:
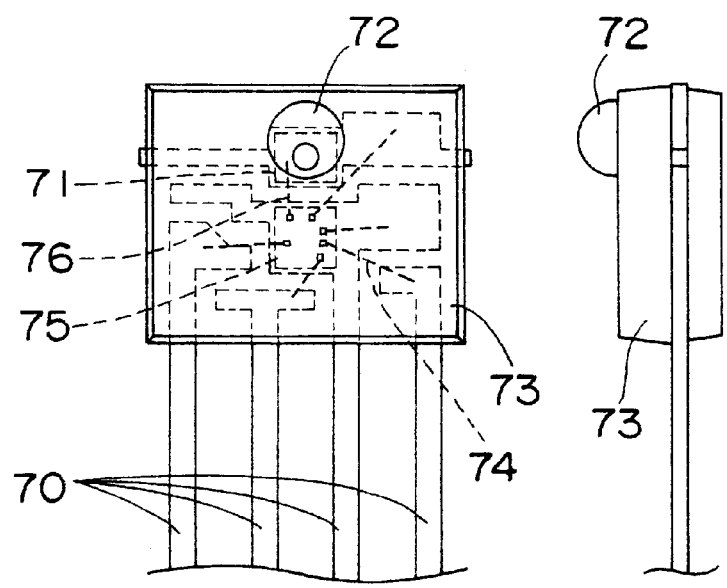
FIG. 10A is a top view of the above light-receiving device.
FIG. 10B is a side view of the above light-receiving device.

FIG. 8 is a flowchart for explaining the process steps of manufacturing a light-receiving device. FIG. 10A is a top view of the light-receiving device. FIG. 10B is a side view of the light-receiving device. As the light-receiving device of this embodiment, a PD (photodiode) 71 (shown in FIG. 10A) is employed.

First, in step S21, the PD 71 and a first-stage amplification IC (hereinafter referred to as a preamplifier) 75 (shown in FIG. 10A) are die-bonded onto a lead frame 70 (shown in FIG. 10A) using silver paste, conductive resin, indium or the like, similarly to the manufacturing flow of the light-emitting device. The lead frame 70 is formed by cutting or etching a metal plate, such as a copper plate or an iron plate, plated with silver. The electrical connection of the PD 71 at its bottom side and the grounding connection of the preamplifier are provided in a prescribed position on the lead frame using the silver paste, conductive resin, indium or the like, whereby the PD and the preamplifier are fixed.

Next, in step S22, the light-receiving surface side of the PD 71 and the preamplifier 75 are connected to prescribed positions on the lead frame 70 by wire bonding using a gold wire or an aluminum wire 74 (shown in FIG. 10A). In this case, the light-receiving surface side electrode of the PD and the PD connection pad of the preamplifier are electrically connected directly to each other by wire bonding using a wire 76 in order to prevent the capacitance from increasing.

Subsequently, in step S23, the resulting assembly is set in a metal mold and encapsulated with a molding resin 73 (shown in FIGS. 10A and 10B) by transfer molding.

As the resin used in the process of manufacturing this light-receiving device, an epoxy-based transparent material is used. At this time, by integrally forming a lens portion 72 (shown in FIGS. 10A and 10B) that has a spherical or aspherical surface, using the molding resin, in a direction inclined with respect to the light-receiving element, the efficiency of coupling of the light-receiving element with the optical fiber during reception can be improved. Although the PD and the preamplifier are constructed of individual chips in this embodiment, it is acceptable to use a single-chip construction of a photoelectric IC (OPIC, OEIC) or the like.

Figure 11:
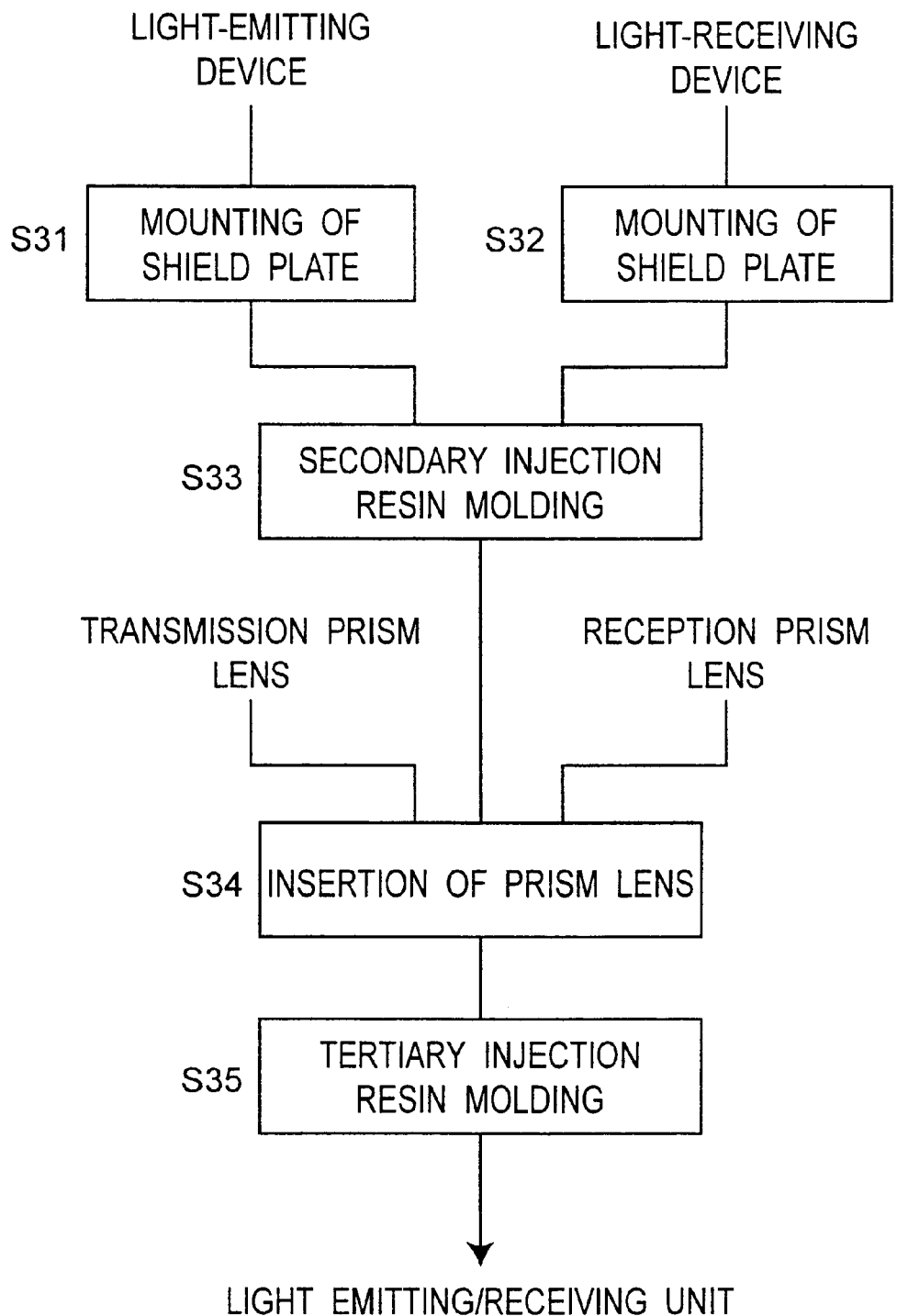
FIG. 11 is a flowchart for explaining the manufacturing process steps for a light emitting/receiving unit.

FIG. 11 is a flowchart for explaining the process steps of manufacturing a light emitting/receiving unit. First, a shield plate is mounted on the light-emitting device in step S31, and a shield plate is mounted on the light-receiving device in step S32.

Next, in step S33, the light-emitting device and the light-receiving device, on each of which the shield plate has been mounted, are integrated with each other into a unit by secondary injection resin molding.

Next, in step S34, prism lenses are inserted in the unit obtained by the secondary injection resin molding.

Next, in step S35, tertiary injection resin molding is performed to form a lens fixing portion 195, which will be described later, to fix the lens.

The steps of mounting the shield plate on the light-emitting device will be described in more detail next.

Figure 12A:
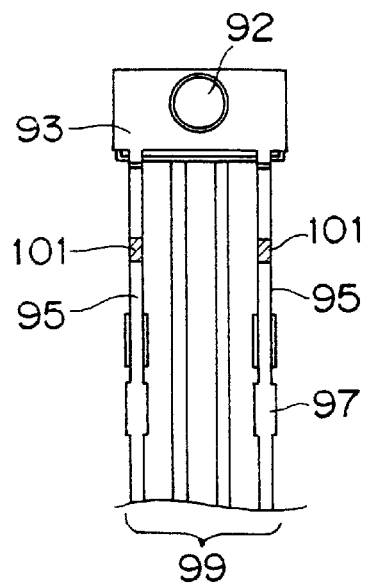
FIG. 12A is a front view of a light-emitting device on which an upper shield plate and a lower shield plate are mounted.
Figure 12B:
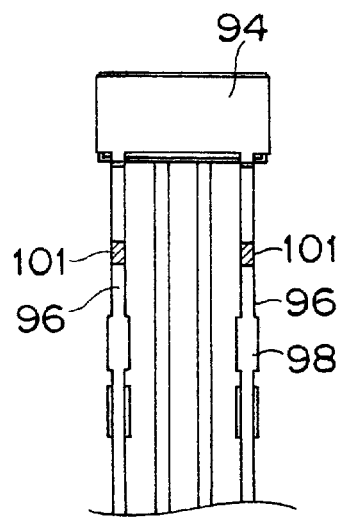
FIG. 12B is a rear view of the above light-emitting device.
Figure 12C:
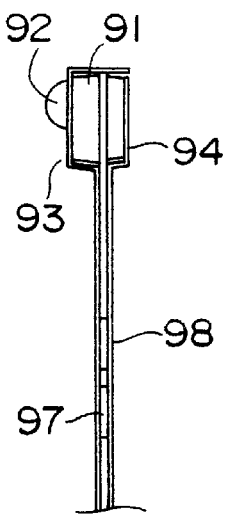
FIG. 12C is a side view of the light-emitting device of FIG. 12A as viewed from the right-hand side.
Figure 13A:
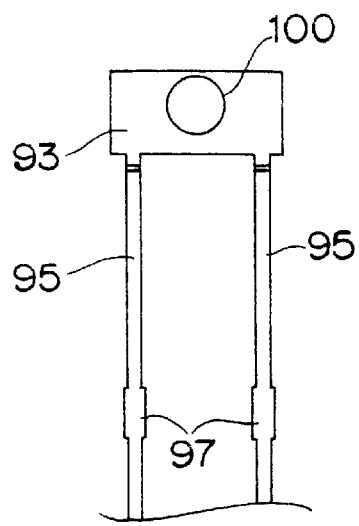
FIG. 13A is a front view of the upper shield plate.
Figure 13B:
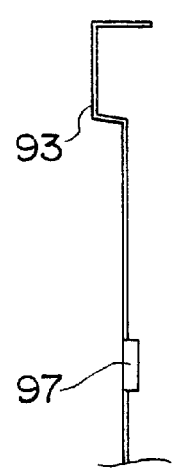
FIG. 13B is a side view of the upper shield plate.

FIG. 12A through FIG. 12C are views of an assembly in which an upper shield plate 93 and a lower shield plate 94 are mounted on the light-emitting device 91 so as to cover the device. FIG. 12A is a front view of the assembly seen from the direction of the lens portion 92 integrally molded with a molding resin. FIG. 12B is a view of the assembly seen from the opposite side from the lens portion 92. FIG. 12C is a side view of the assembly seen from the right-hand side of FIG. 12A. FIG. 13A is a front view of the upper shield plate 93. FIG. 13B is a side view of the upper shield plate 93. FIG. 14A is a front view of the lower shield plate 94. FIG. 14B is a side view of the lower shield plate 94.

In order to restrain the influence of electromagnetic noises, which are generated from the LED and incident on the adjacent light-receiving device and the amplification circuit for the light-receiving device, the light-emitting device 91 shown in FIGS. 12A through 12C is shielded with a structure in which the device is covered with a metal plate of iron, copper or the like as a means for removing electromagnetic noises radiated to the outside from the light-emitting device, wires and lead terminals when the light-emitting element is subjected to high-speed switching.

In order to easily perform the assembling, this shield plate provided by the metal plate of iron, copper or the like is divided into two parts of the upper shield plate 93 and the lower shield plate 94. The upper shield plate 93 has a structure for covering the upper portions other than the lens portion 92 and is provided with a hole 100 (shown in FIG. 13A) for avoiding the lens portion 92. The upper shield plate 93 is electrically connected to the ground by means of connection terminals 95, and the lower shield plate 94 is electrically connected to the ground by means of connection terminals 96, restraining the entry of electromagnetic noises. The connection terminals 95 and 96 of the upper shield plate 93 and the lower shield plate 94 are extended in a direction in which the lead terminals 99 of the light-emitting device 91 are extended for the provision of a structure capable of providing continuity to the grounding terminals included in the lead terminals 99. Thus, the connection terminals 95 and 96 are electrically connected to the ground for the restraint of the entry of electromagnetic noises. The electrical connection of the connection terminals 95 and 96 of the upper shield plate 93 and the lower shield plate 94 with the grounding terminals (located on both sides in FIG. 12A) in the lead terminals 99 of the light-emitting device 91 are provided by welding (or soldering) at connecting portions 101, and the upper shield plate 93 and the lower shield plate 94 are positioned and fixed.

As measures for positioning and fixing the upper shield plate 93 and the lower shield plate 94, a structure for preventing the upper shield plate 93 from being displaced in the upward, downward, rightward and leftward directions as shown in FIG. 12A is provided by making the hole 100 of the upper shield plate 93 for avoiding the lens portion 92 of the light-emitting device 91 have a hole diameter slightly greater than the diameter of the lens portion 92. In this embodiment, the hole 100 has a diameter of the lens portion diameter plus 0.1 mm. Further, by providing the connection terminals 95 and 96 of the upper shield plate 93 and the lower shield plate 94 with sectionally U-shaped portions 97 and 98 as the positioning and fixing means, reliable positioning and fixation are achieved by sideways holding the grounding terminals (located on both sides in FIGS. 12A and 12B) of the lead terminals 99 of the light-emitting device 91. Moreover, the upper shield plate 93 and the lower shield plate 94 not only restrain the radiation of electromagnetic noises but also restrain the unnecessary light emission from the device portions other than the lens portion 92.

The process of mounting the shield plate on the light-receiving device will be described next.

Figures 16A, 16B:
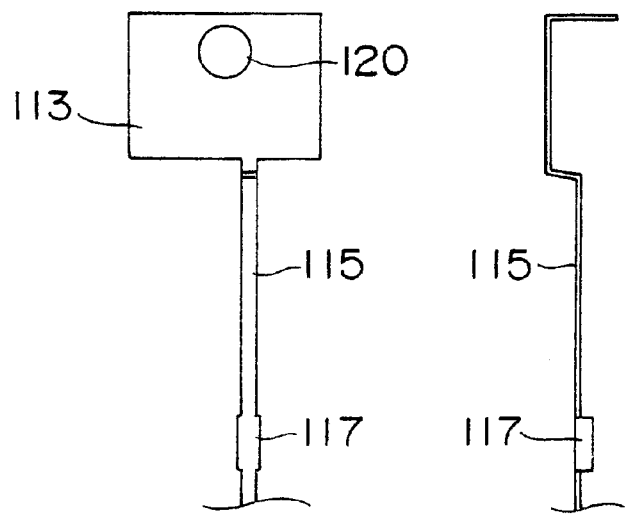
FIG. 16A is a front view of the upper shield plate.
FIG. 16B is a side view of the upper shield plate.
Figures 17A, 17B:
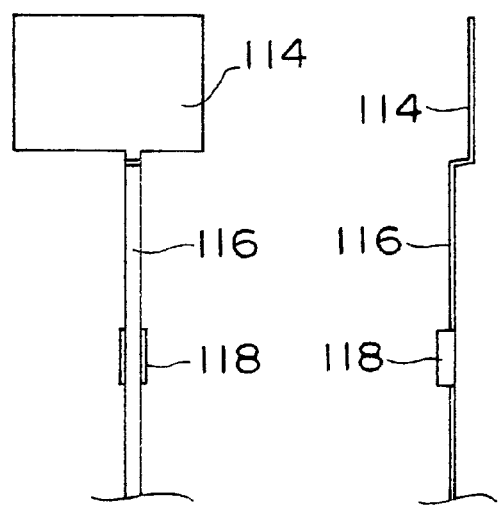
FIG. 17A is a front view of the lower shield plate.
FIG. 17B is a side view of the lower shield plate.

FIG. 15A through FIG. 15C are views of an assembly in which an upper shield plate 113 and a lower shield plate 114 are mounted on a light-receiving device 111 so as to cover the device. FIG. 15A is a front view of the assembly seen from the direction of a lens portion 112 integrally formed by a molding resin. FIG. 15B is a view of the assembly seen from the opposite side from the lens portion. FIG. 15C is a side view of the assembly seen from the right-hand side of FIG. 15A. FIG. 16A is a front view of the upper shield plate 113. FIG. 16B is a side view of the upper shield plate 113. FIG. 17A is a front view of the lower shield plate 114. FIG. 17B is a side view of the lower shield plate 114.

In order to restrain the influence of electromagnetic noises from the outside, such as external noises from the adjacent light-emitting device and the electric circuit for driving the light-emitting device, the light-receiving device 111 shown in FIGS. 15A through 15C is shielded with a structure in which the device is covered with a metal plate of iron, copper or the like as a noise removing means.

In order to easily perform the assembling, this shield plate provided by the metal plate of iron, copper or the like is divided into two parts of the upper shield plate 113 and the lower shield plate 114. The upper shield plate 113 has a structure for covering the device upper portions other than the lens portion 112 and is provided with a hole 120 (shown in FIG. 16A) for avoiding the lens portion 112. The upper shield plate 113 is electrically connected to the ground by means of a connection terminal 115, and the lower shield plate 114 is electrically connected to the ground by means of a connection terminal 116, restraining the entry of electromagnetic noises. The connection terminals 115 and 116 of the upper shield plate 113 and the lower shield plate 114 are extended in a direction in which the lead terminals 119 of the light-receiving device 111 are extended for the provision of a structure capable of providing continuity to a grounding terminal (the second one from the right-hand side in FIG. 15A) included in the lead terminals 119. Thus, the connection terminals 115 and 116 are electrically connected to the ground for the restraint of the entry of electromagnetic noises. The electrical connection of the connection terminals 115 and 116 of the upper shield plate 113 and the lower shield plate 114 with the grounding terminal (the second one from the right-hand side in FIG. 15A) in the lead terminals 119 of the light-receiving device 111 are provided by welding (or soldering) at a connecting portion 121, and the upper shield plate 113 and the lower shield plate 114 are positioned and fixed.

As means of positioning and fixing the upper shield plate 113 and the lower shield plate 114, a structure for preventing the upper shield plate 113 from being displaced in the upward, downward, rightward and leftward directions as shown in FIG. 15A is provided by making the hole 120 of the upper shield plate 113 for avoiding the lens portion 112 of the light-receiving device 111 have a hole diameter slightly greater than the diameter of the lens portion 112. In this embodiment, the hole 120 has a diameter of the diameter of the lens portion 112 plus 0.1 mm. Further, by providing the connection terminals 115 and 116 of the upper shield plate 113 and the lower shield plate 114 with sectionally U-shaped portions 117 and 118 as the positioning and fixing means, reliable positioning and fixation are achieved by sideways holding the grounding terminal in the lead terminals 119 of the light-receiving device. Moreover, the upper shield plate 113 and the lower shield plate 114 not only restrain the radiation of electromagnetic noises but also restrain the incidence of unnecessary light from the device portions other than the lens portion 112.

The process of integrating the light-emitting device and the light-receiving device, on which the shield plates are mounted, by secondary injection resin molding will be described next.

FIG. 18A is a front view of the light emitting/receiving unit integrated by the secondary injection resin molding. FIG. 18B is a sectional view taken along line XVIIIb—XVIIIb of FIG. 18A. FIG. 18C is a side view of the light emitting/receiving unit. FIG. 18D is a rear view of the light emitting/receiving unit.

As shown in FIGS. 18A through 18D, the light-emitting device 131 with the welded shield plates 138 and 139 and the light-receiving device 132 with the welded shield plates 140 and 141 are positioned and fixed, with the lead frame of the light-emitting device 131 and the lead frame of the light-receiving device 132 arranged so as to extend to the mutually opposite sides. By arranging the light-emitting device 131 and the light-receiving device 132 such that their sides opposite from the lead terminals 133, 134 confront each other, an interval or spacing between the lead terminals 133 of the light-emitting device 131 and the lead terminals 134 of the light-receiving device 132 can be made large, so that the influence of the electromagnetic noises from the light-emitting device 131 on the light-receiving device 132 can be restrained. Moreover, for the reason that the influence of electromagnetic noises due to electromagnetic induction between the lead terminals of the light-emitting device and the lead terminals of the light-receiving device is considered to be large in the adjacent arrangement, the influence of electromagnetic noises can be made smaller with the aforementioned spaced arrangement.

The positioning and fixing means of the light-emitting device 131 and the light-receiving device 132 are provided by the secondary injection resin molding on the basis of positioning pin holes 136 and 137 of the lead frames of the light-emitting device 131 and the light-receiving device 132 with an injection molding resin 135. In this secondary injection resin molding stage, boss pin holes 142 and 143 (shown in FIG. 18A) to be used as a positioning means for the prism lenses that serve as an optical element for transmission and an optical element for reception, described later, are formed at the same time.

The process of inserting the prism lenses into the light emitting/receiving unit integrated by the secondary injection resin molding will be described next.

The prism lenses to be inserted will be described first. FIG. 19A is a front view of a transmission prism lens. FIG. 19B is a side view seen from the upper side of the transmission prism lens of FIG. 19A. FIG. 19C is a side view seen from the right-hand side of the transmission prism lens of FIG. 19A.

In this embodiment, the transmission prism lens 161 shown in FIGS. 19A through 19C is employed as an optical element for transmission. The transmission prism lens 161 has a structure in which a prism portion 162 and a condenser lens portion 163 are combined into one piece. The transmission prism lens 161 is formed by the injection molding method or the like, and it is desirable to select a material having excellent weather resistance for the prism lens. For example, acrylic, PMMA (polymethyl methacrylate) or the like can be employed. The transmission prism lens 161 is provided with boss pins 164 that are integrally formed in the injection molding stage as a positioning means for the second injection mold in a portion that has no relation to the optics. Moreover, by providing a satin finish to the surfaces 165 and 166 of the transmission prism lens 161, which do not contribute to the optics, so that the unnecessary light emission and reflection of the emission light from the optical fiber are restrained.

FIG. 20A is a front view of the reception prism lens. FIG. 20B is a side view seen from the upper side of the reception prism lens of FIG. 20A. FIG. 20C is a side view seen from the right-hand side of the reception prism lens of FIG. 20A.

In this embodiment, the reception prism lens 171 shown in FIGS. 20A through 20C is employed as an optical element for reception. The reception prism lens 171 has a structure in which a prism portion 172 and a condenser lens portion 173 are integrated with each other. The reception prism lens 171 is also formed by the injection molding method or the like similarly to the transmission prism lens 161, and it is desirable to select a material of excellent weather resistance for the prism lens. For example, acrylic, PMMA or the like is employable. The reception prism lens 171 is provided with boss pins 174 that are integrally formed in the injection molding stage as a positioning means for the second injection mold in a portion that has no relation to the optics. Moreover, by providing a satin finish to the surfaces 175 and 176 of the reception prism lens 171, which do not make any optical contribution so that the unnecessary light emission and reflection of the emission light from the optical fiber are restrained.

FIG. 21A is a front view of a light emitting/receiving unit in which a transmission prism lens 182 and a reception prism lens 183 are inserted. FIG. 21B is a sectional view taken along line XXIb—XXIb of FIG. 21A. FIG. 21C is a side view of the light emitting/receiving unit. FIG. 21D is a rear view of the light emitting/receiving unit.

As shown in FIGS. 21A through 21D, the transmission prism lens 182 and the reception prism lens 183 are fixed in positions by inserting the boss pins 184 and 185 as a positioning means into the boss pin holes 142 and 143 (shown in FIG. 18A) formed in the secondary injection molding process for integrating or uniting the light-receiving and -emitting devices.

It is possible that the transmission prism lens 161 and/or the reception prism lens 171 falls off the assembly during the subsequent manufacturing process steps if they are simply inserted in the secondary injection molded product.

Therefore, lens fixing portions 195 are formed by tertiary injection resin molding to fix the lenses.

Further, in the lens fixing portion 195, pins 186 and 187 employed as a positioning means with respect to a jack section 202 (shown in FIG. 22A) described later are provided in two places by integral molding. The pins 186 and 187 have different pin diameters in order to prevent the insertion thereof in the wrong directions with regard to the transmission side and the reception side when positioned and fixed with respect to the jack section 202. Moreover, since mere press-fitting involves a risk of detachment of the jack section 202 from the light emitting/receiving unit, the jack section 202 is provided with hooks 205 (shown in FIG. 22A), and the light emitting/receiving unit 201 that has undergone the tertiary injection resin molding is provided with groove portions 194 to receive the hooks 205. The hooks 205 of the jack section 202 and the groove portions 194 of the light emitting/receiving unit 201 constitute an anti-detachment means. In the tertiary injection resin molding stage, by carrying out the tertiary injection resin molding by performing positioning on the basis of the pin holes 188 and 189 of the lead frames together with the light-emitting device 190 and the light-receiving device 191 as in the secondary injection resin molding stage, it is possible to improve the positioning accuracy of the positioning pins 186 and 187 with respect to the light-emitting device 190, light-receiving device 191 and lenses 192 and 193, which are integrally molded by transfer molding, the prism lenses 182 and 183 for transmission and reception, and the jack section 202.

Figure 22D:
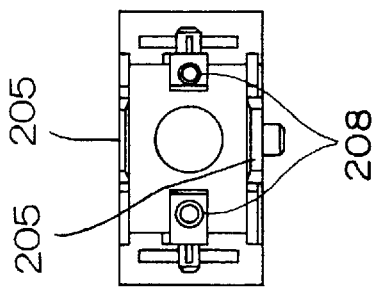
FIG. 22D is a view of the jack section of FIG. 22A seen from the lower side.
Figure 22A:
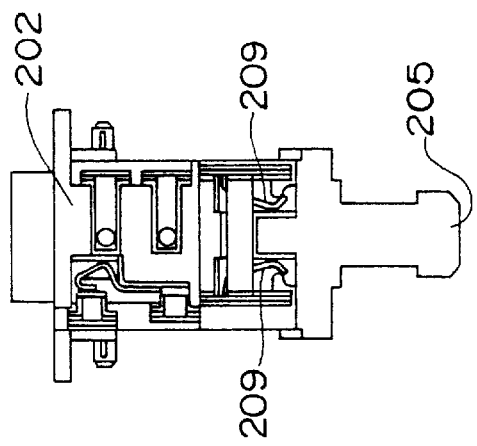
FIG. 22A is a side view of a jack section.
Figure 22B:
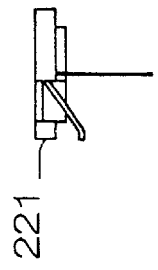
FIG. 22B is a side view of a partition plate unit.
Figure 22C:
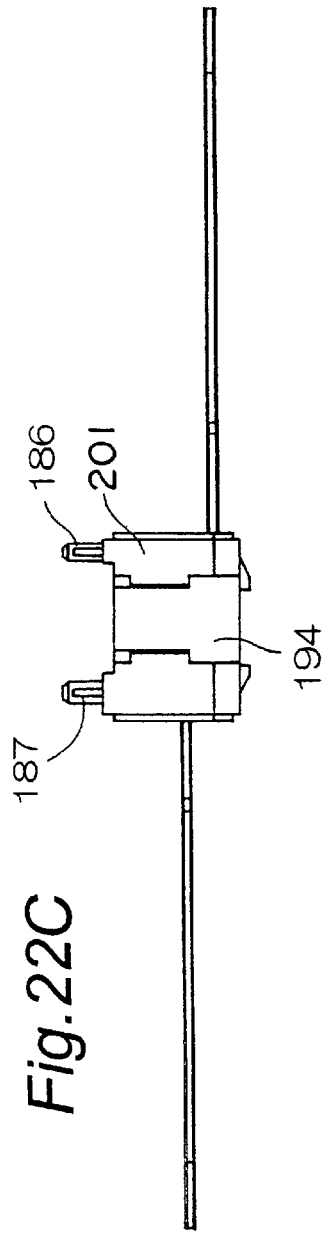
FIG. 22C is a side view of a light emitting/receiving unit.

FIG. 22A is a side view of the jack section 202. FIG. 22B is a side view of a partition plate unit 221. FIG. 22C is a side view of a light emitting/receiving unit 201. FIG. 22D is a view of the jack section 202 of FIG. 22A as viewed from the lower side.

As shown in FIGS. 22A through 22D, the jack section 202, the partition plate unit 221 and the light emitting/receiving unit 201 are assembled together through positioning by inserting the pins 186 and 187 of the light emitting/receiving unit 201 formed by the tertiary injection resin molding into pin holes 208 provided in the jack section 202. The jack section 202 has a plug insertion hole (indicated by 24 in FIG. 3) and an engagement retaining portion for enabling the attaching and detaching of an optical fiber cable (not shown) to which an optical plug is attached. This engagement retaining portion is designed to detachably retain the optical plug inserted in the plug insertion hole in the prescribed position of the jack section 202 by holding the optical plug by a constricted portion (242 in FIG. 29) by means of a leaf spring or the like (209 in FIG. 22). Moreover, as described above, since mere press-fitting involves a risk of detachment of the light emitting/receiving unit from the jack section 202, the jack section 202 is provided with hooks 205, 205, and the light emitting/receiving unit 201 that has undergone the tertiary injection resin molding is provided with groove portions 194 on both sides to receive the hooks 205, 205 to thereby prevent the detachment of the jack in the pulling direction. The partition plate unit 221 for separating the optical path of the transmission signal light from the optical path of the reception signal light is held between the jack section 202 and the light emitting/receiving unit 201. The partition plate unit 221 is constructed so as to be movable in the lengthwise direction of the optical fiber by virtue of a partition plate unit retaining portion 215 provided at the jack section 202 and a spring 212 as a spring means.

Figure 24:
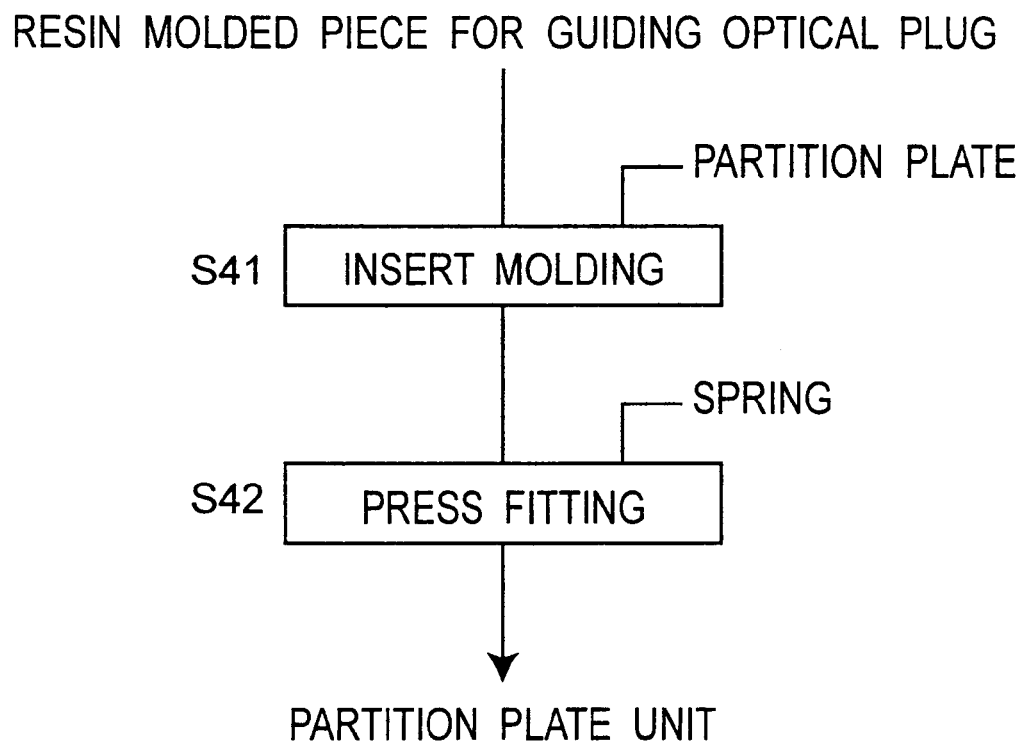
FIG. 24 is a flowchart for explaining a method of manufacturing the above partition plate unit.

FIG. 24 shows a flowchart for explaining the manufacturing method for the partition plate unit. This partition plate unit is manufactured by integrating the partition plate 211 with resin molded piece 213 for guiding the optical plug by insert molding in step S41 and then press-fitting the spring 212. The spring 212 may be integrated with the resin molded piece 213 by insert molding.

Figure 23:
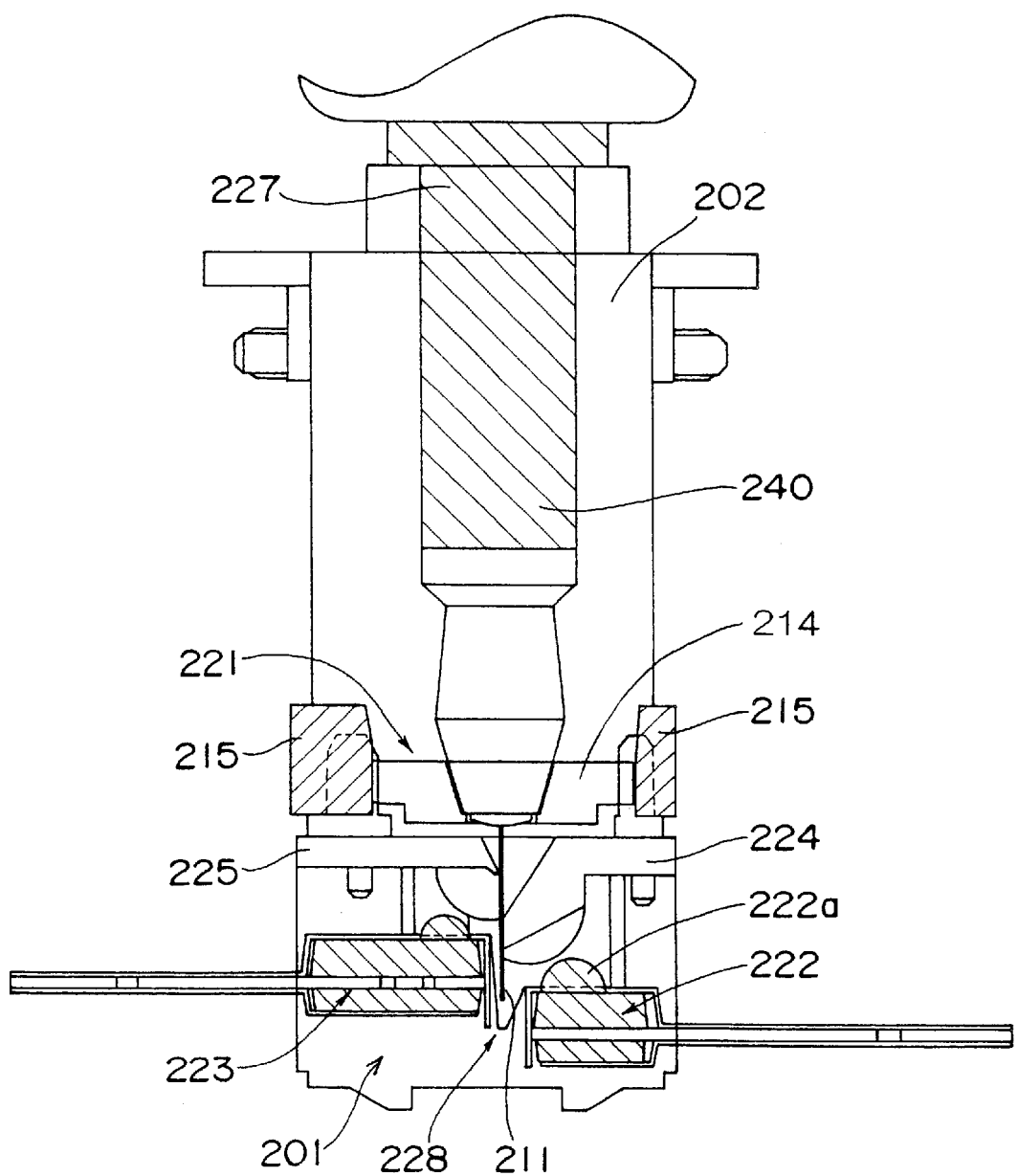
FIG. 23 is a sectional view of an optical transmitter-receiver module in a state in which an optical plug is inserted in a plug insertion hole.

FIG. 23 shows a sectional view of an optical transmitter-receiver module in a state in which an optical plug 240 is inserted in a plug insertion hole 227. As shown in FIG. 23, the partition plate unit 221 is provided with a partition plate 211, which is positioned between a light-emitting device 222 and a light-receiving device 223 and between a transmission prism lens 224 and a reception prism lens 225, and an engagement portion 214 to which one end of the partition plate 211 is fixed. A partition plate unit retaining portion 215 for retaining the partition plate unit 221 movably in the direction of the optical axis of the optical fiber is provided on the jack section 202 side of the partition plate unit 221.

Figure 25:
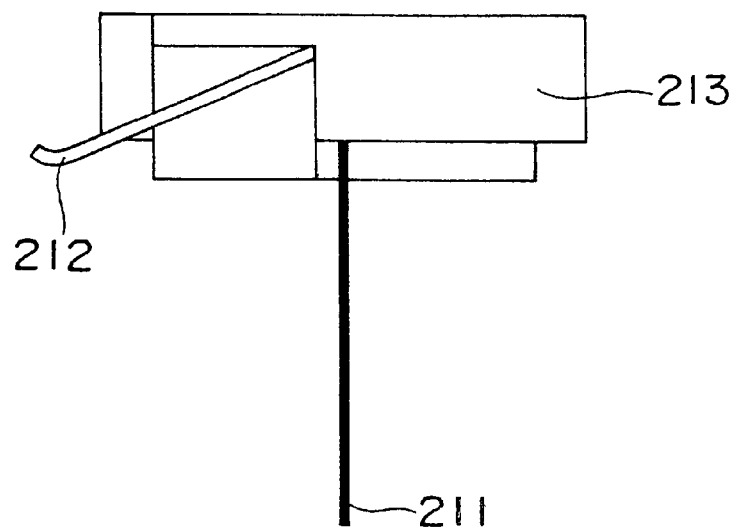
FIG. 25 is a side view of a partition plate unit.
Figure 26:
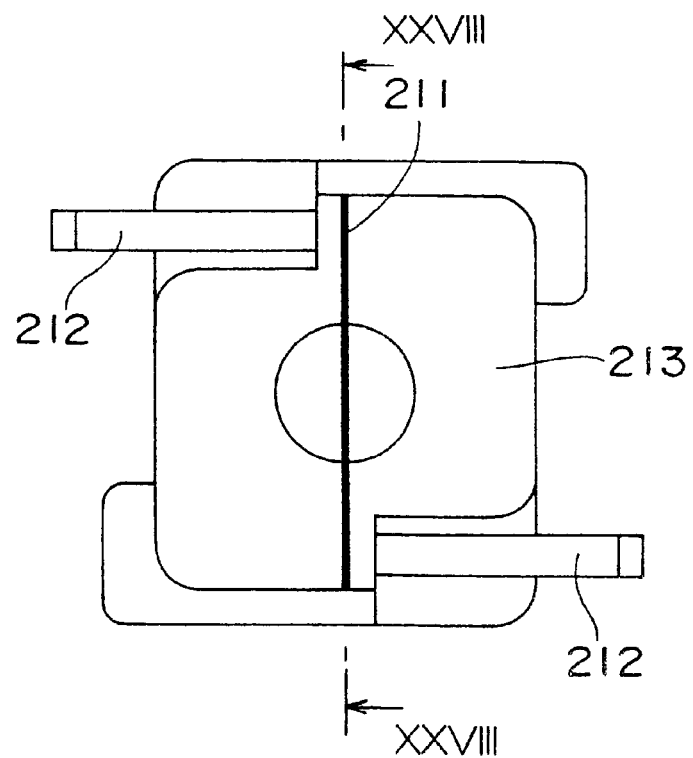
FIG. 26 is a front view of the above partition plate unit.
Figure 27:
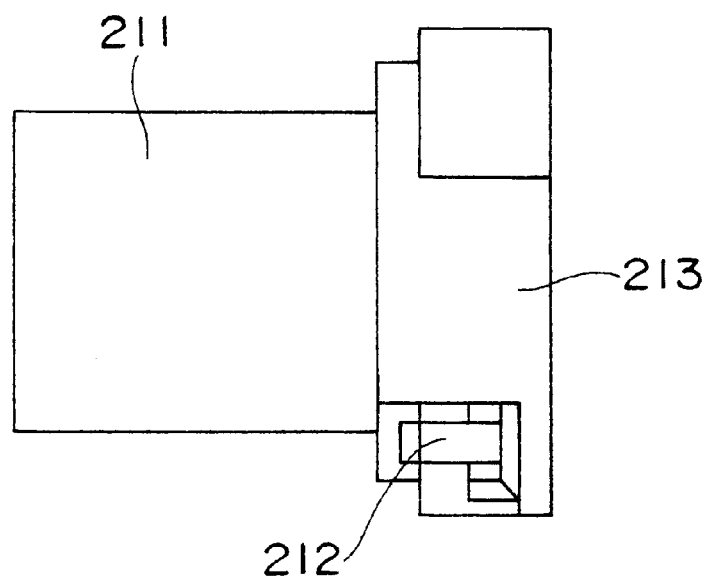
FIG. 27 is a side view of the partition plate unit of FIG. 26 seen from the right-hand side.
Figure 28:
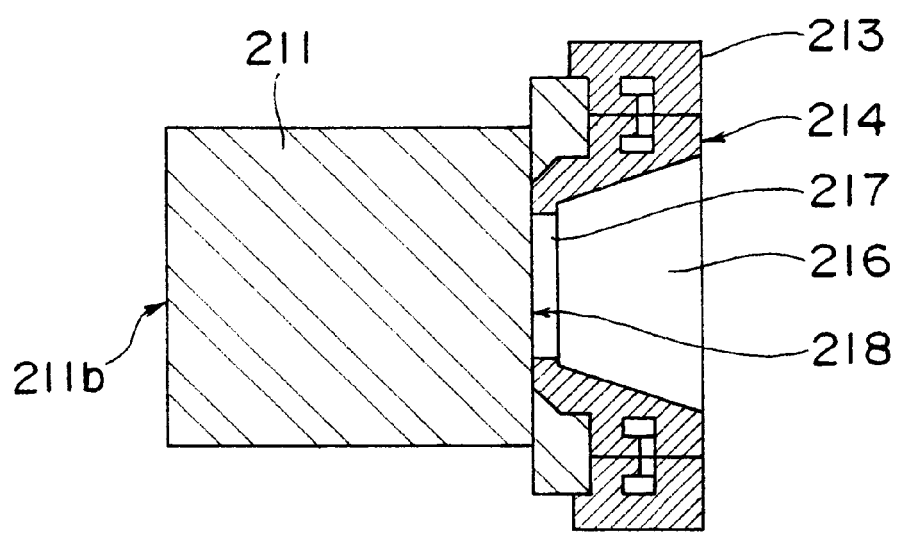
FIG. 28 is a sectional view taken along line XXVIII—XXVIII of FIG. 26.

FIG. 25 is a side view of the partition plate unit 221. FIG. 26 is a front view of the partition plate unit 221. FIG. 27 is a side view of the partition plate unit 221 of FIG. 26 seen from the right-hand side. FIG. 28 is a sectional view taken along line XXVIII—XXVIII of FIG. 26.

As is clearly depicted in the sectional view of the partition plate unit 221 shown in FIG. 28, the engagement portion 214 has a generally truncated cone-shaped hole 216 at the center to smoothly house the front end of the optical plug 240 (shown in FIG. 23). The engagement portion 214 also has an annular projection 217 that projects inwardly in the radial direction at the bottom of this hole 216. This annular projection 217 has a thickness smaller than 0.4 mm (0<x<0.4 mm). The thickness of the annular projection 217 corresponds to an interval between the front end of the optical plug 240 and a surface 218 (located on the side opposite to the hole 216) of the partition plate 211. The partition plate 211 is constructed of a phosphor bronze plate or a stainless steel plate of a thickness of about 50 µm and is fixed to the engagement portion 214 at the bottom portion of the hole 216 by insert molding. The surface 218 (located on the side opposite to the hole 216) of the partition plate 211 is coated with a photoabsorption material (black paint containing carbon or the like), which forms a photoabsorption layer. Moreover, as is clearly depicted in the enlarged side view of the partition plate unit 221 shown in FIG. 25 and the front view of the partition plate unit 221 shown in FIG. 26, the leaf spring 212, which is constructed of a phosphor bronze plate, a stainless steel plate or a beryllium copper, is mounted to the engagement portion 214 in two places (on the upper left side and the lower right side of FIG. 26) by insert molding or press-fitting. The spring 212 is always brought in contact with the light emitting/receiving unit 201 (shown in FIG. 23). Therefore, the engagement portion 214 is always urged toward the plug insertion hole 227 (shown in FIG. 23), i.e., toward the optical fiber by the spring 212. In FIG. 23, the engagement portion 214 is slidably fit in a rectangular hole (not shown) provided at the partition plate unit retaining portion 215 of the jack section 202. Therefore, if a force greater than the force of the spring 212 is exerted on the engagement portion 214, then the engagement portion 214 and the partition plate 211 fixed to the engagement portion 214 move in the direction opposite from the plug insertion hole 227 (i.e., toward the light-emitting/receiving unit 201).

Figure 29:
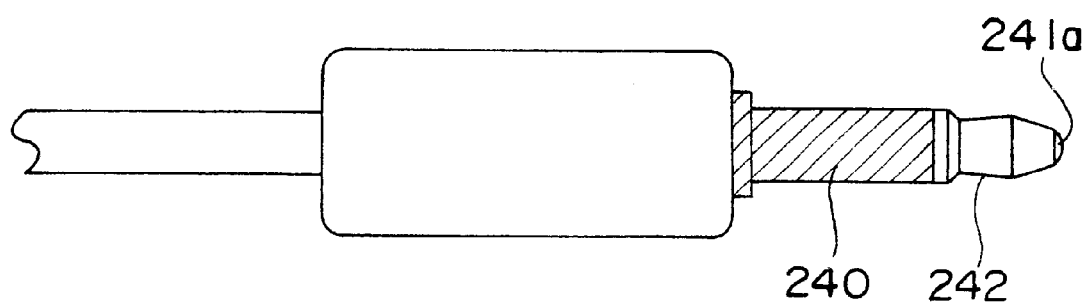
FIG. 29 is a side view of an optical cable.

The optical transmitter-receiver module of this embodiment constitutes an optical transmitter-receiver system together with the optical cable shown in FIG. 29. This optical cable has optical plugs 240 at the opposite end portions (only one end portion is shown in FIG. 29), and an optical fiber is inserted in the optical plugs 240. As is apparent from FIG. 29, this optical plug 240 is provided with no anti-rotation mechanism and is therefore rotatable. An optical fiber end surface 241a at the front end of the optical plug 240 projects from the plug (ferrule) end, and its outside portion in the radial direction covers part of the plug end surface 240a (see FIG. 30). The optical fiber end surface 241a is a curved surface rotationally symmetrical relative to the optical axis of the optical fiber and is a convex surface. A flux of reflection light from the curved surface is expanded and therefore absorbed into the cladding of the fiber when propagating through the fiber. Consequently, the reflection light going out of the fiber becomes reduced in comparison with an optical fiber that has a flat end surface.

Figure 30:
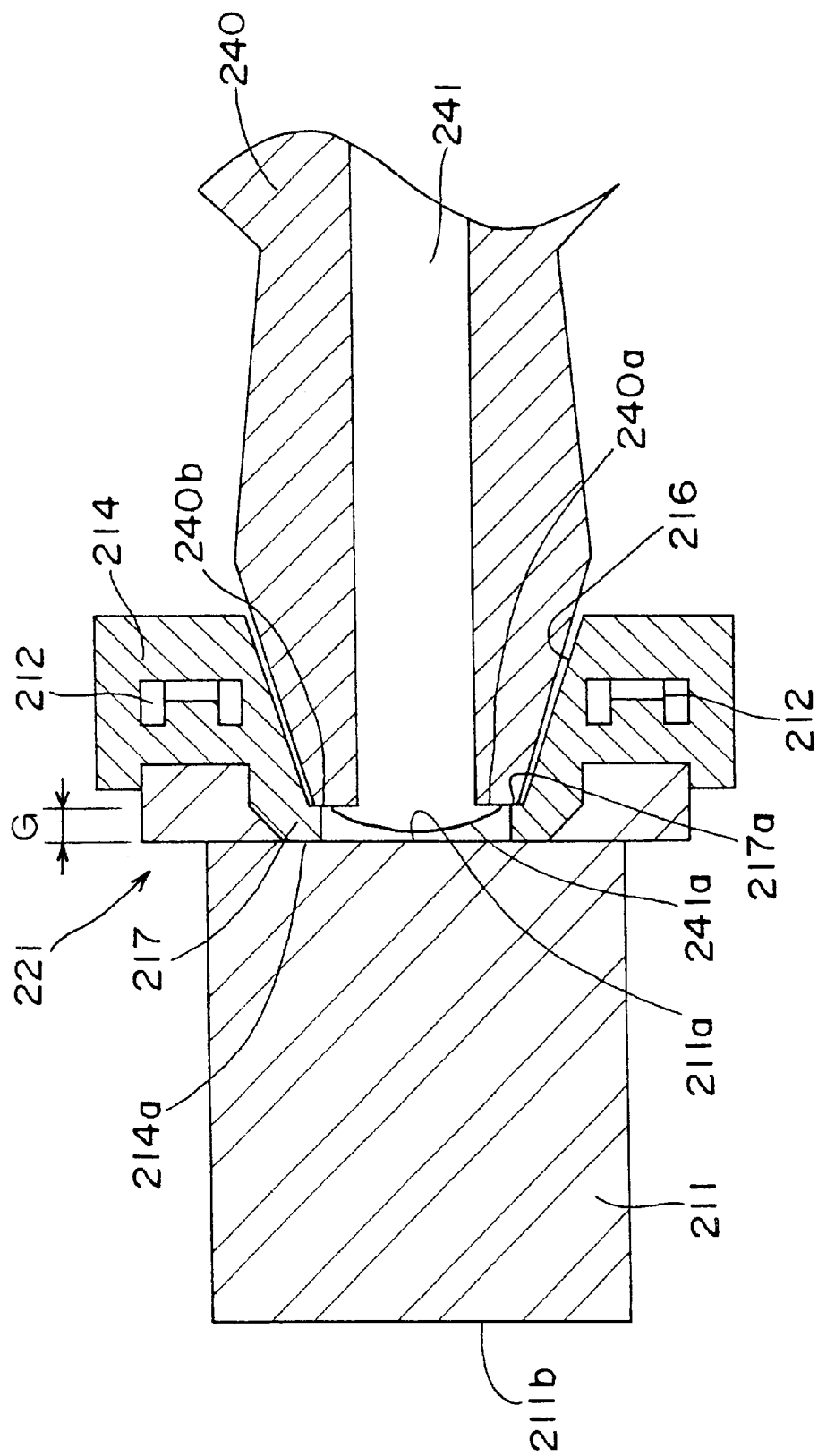
FIG. 30 is a sectional view showing a state in which the front end of an optical plug is fit in a hole of an engagement portion of the partition plate unit.

FIG. 30 is a sectional view showing a state in which the front end of the optical plug 240 is fit in the hole 216 of the engagement portion 214 of the partition plate unit 221.

As is clearly depicted in FIG. 30, when the optical plug 240 is put in the optical transmitter-receiver module through the plug insertion hole 227, the front end of the optical plug 240 is fit in the hole 216 of the engagement portion 214 of the partition plate unit 221, and a portion 240b that belongs to the plug end surface 240a and is not covered with the fiber end surface comes into contact with a surface (engagement surface) 217a of the annular projection 217 of the engagement portion 214. As a result, the relative position of the front end of the optical fiber 241 to the partition plate 211 is determined. At this time, a gap G corresponding to the thickness of the annular projection 217 of the engagement portion 214 is defined between the plug end surface 240a (hence the outer edge of the optical fiber end surface 241a) and the opposite surface 211a of the partition plate 211. Since the optical fiber end surface 241a is made convex, the gap between the optical fiber end surface 241a and the opposite surface 211a of the partition plate 211 decreases as going towards the center of the fiber. However, due to the presence of the annular projection 217 that is projecting inward in the radial direction, the optical fiber end surface does not touch the opposite surface of the partition plate. The dimension of this gap G, which depends on the structure of the optical system, should preferably have a value smaller than 0.4 mm (0 mm<G<0.4 mm) and be as small as possible. In this embodiment, the gap G is set at about 0.3 mm. It was experimentally confirmed that the bit error rate (BER) could be $10^{-12}$ when the gap G was about 0.3 mm, and the full-duplex communication system can sufficiently be provided.

As is obvious from the above, the annular projection 217 has a thickness greater than the amount of projection of the convex surface of the optical fiber 241 from the optical plug end surface 240b. Moreover, the opposite surface 211a (facing the optical fiber end surface 241a) of the partition plate 211 has a linear shape such that no gap is defined between an opposite surface 214a (located on the side opposite from the surface 217a to be engaged with the optical plug 240) of the plastic-molded engagement portion 214 and the opposite surface 211a of the partition plate 211.

The engagement portion 214 of the partition plate unit 221 is urged toward the plug insertion hole 227 (shown in FIG. 23), i.e., toward the optical plug 240, by the spring 212. Therefore, the engagement surface 217a is always pressed against the plug end surface 240a with a minute force. Moreover, the optical fiber end surface 241a is a curved surface rotationally symmetrical relative to the optical axis of the optical fiber 241. Therefore, even if the optical plug 240 is rotated, the shape of the optical fiber end surface 241a does not change with respect to the opposite surface 211a of the partition plate 211, and the gap G is kept constant.

The optical plug 240 including the optical fiber 241 has a variation in length due to the manufacturing process. Therefore, if the position of the partition plate 211 is fixed by fixing the partition plate unit 221 to the jack section 202 (shown in FIG. 23) or by another means, then the gap between the optical fiber end surface 241a and the opposite surface 211a of the partition plate 211 may become greater than is set, depending on the length of the optical plug 240. If the optical plug 240 is a round type plug according to the EIAJ-RC5720B standard, then the length of the plug may vary between 14.7 and 15 mm due to the variations in the manufacturing process. If the gap is set at 0.2 mm and the position of the partition plate 211 is fixed in conformity to the longest optical plug 240, then there may occur a gap of 0.5 mm depending on the plug. However, in the optical transmitter-receiver module of this embodiment, the initial position of the partition plate unit 221 (more specifically, of the engagement portion 214) is set at a position that can cope with the length of the possible shortest optical plug 240, and the partition plate unit 221 is made movable in the lengthwise direction of the optical fiber 241 with the engagement portion 214 pressed against the plug end surface 240b by the minute force of the spring 212. Therefore, whatever length the optical plug 240 inserted has, the interval of the aforementioned gap can be kept constant.

Moreover, since the plug end surface 240b in contact with the engagement surface 217a slides on the latter by the rotation of the optical plug 240, it is desirable to use for the engagement surface 217a a material of a small sliding friction coefficient and excellent abrasion resistance, such as fluoroplastic and ultrahigh molecular weight polyethylene.

In the assembly 1 of the structure in which the partition plate unit 221 is held between the light emitting/receiving unit 201 and the jack section 202, a surface 211b of the partition plate 211, which is located on the side opposite from the opposite surface 211a facing the optical fiber 241, is to be inserted into the partition plate guiding groove portion 228 (shown in FIG. 23) of the light emitting/receiving unit 201. As shown in FIG. 23, since the light-emitting device 222 is located farther apart from the optical fiber end surface in the direction of the optical axis of the optical fiber 241 than the light-receiving device 223 is, the partition plate 211 is made in a length such that the partition plate 211 extends beyond the bottom portion of the lens 222a of the light-emitting device 222. With this arrangement, light from the light-emitting device 222 that is not incident on the transmission prism lens 224, is prevented from enter the light-receiving device 223 directly or after being reflected on the reception prism lens 225.

The operation of the optical transmitter-receiver system of this embodiment will be described next.

Figure 5:
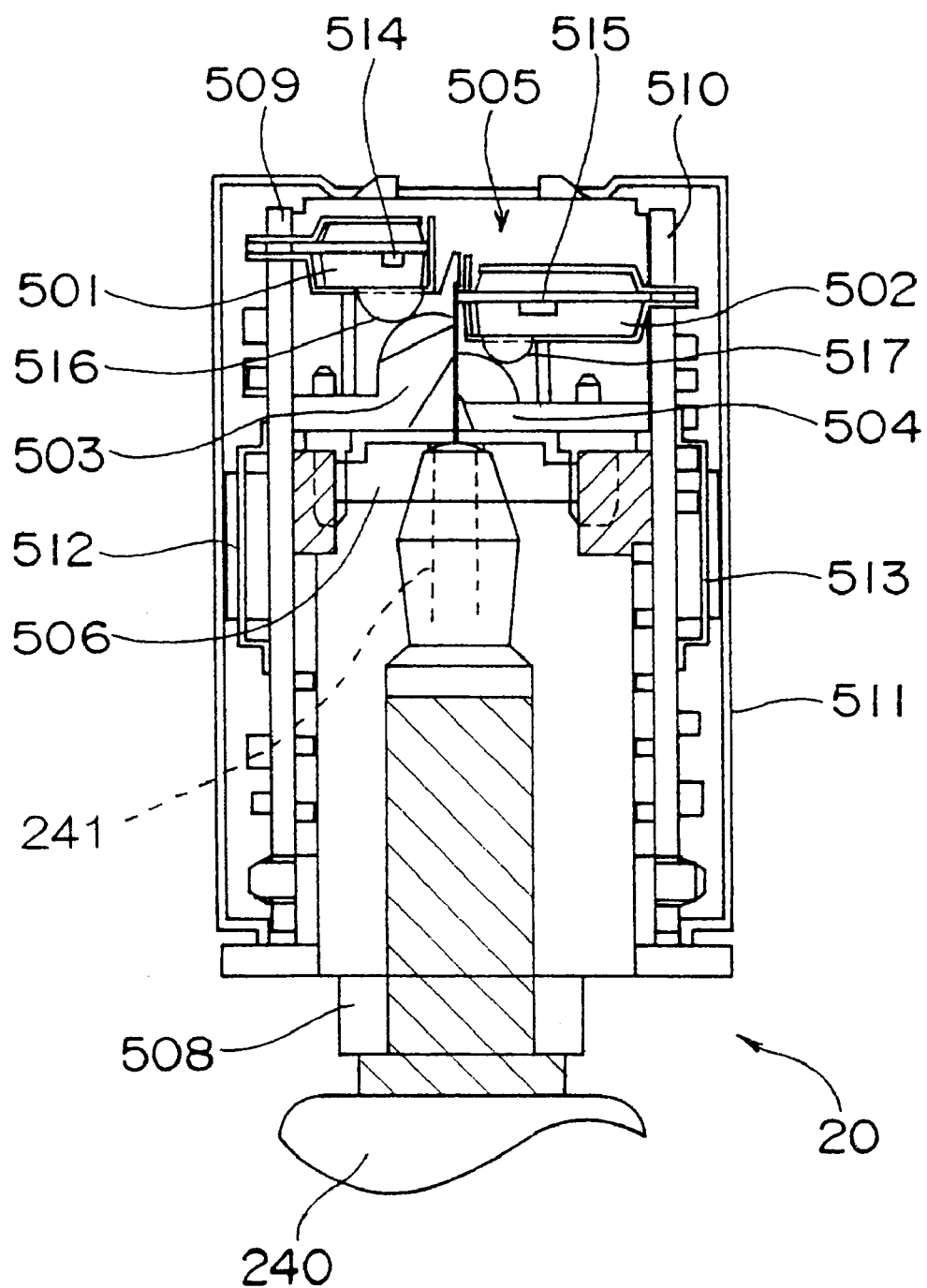
FIG. 5 is a sectional view taken along line V—V of FIG. 4.

FIG. 5 shows a sectional view of the essential part of one side of the optical transmitter-receiver system where the optical plugs 240 at both ends of the optical cable are each inserted in the respective optical transmitter-receiver modules. Once a transmission signal (electrical signal) is inputted from the outside of the optical transmitter-receiver module 20 via the input/output terminal 25 (shown in FIG. 4), an LED 514 that serves as a light-emitting device is driven by a transmission drive electric circuit board 509 on which a transmission drive IC 512 is mounted, so that transmission signal light rays (optical signal) are emitted from the LED 514. The transmission signal light rays are substantially collimated by a transmission lens 516 formed at the surface of the light-emitting device 501, and then enter a transmission prism lens 503, by which the light rays deflect the optical path and enter the optical fiber 241. At this time, transmission light rays reflected from an end surface, of the optical fiber 241, near to the optical transmission and reception module (hereinafter referred to as an "optical fiber end surface on the near side") pass through the gap G between the partition plate 211 and the optical fiber end (shown in FIG. 30) and enter the light-receiving device 502. At this time, since the gap G has a small dimension of 0.3 mm, the incident light is sufficiently small in light quantity.

The transmission light rays which have been transmitted through the optical fiber are partly reflected by an end surface, of the optical fiber 241, far from the optical transmission and reception module (hereinafter referred to as an "optical fiber end surface on the far side"). However, since the optical fiber end surface on the far side is a convex surface, a flux of reflection light rays is expanded and absorbed into the cladding while propagating through the optical fiber 241. As a result, little reflection light goes out of the optical fiber end surface 241a on the near side.

On the other hand, the transmission signal light discharged from the optical fiber end surface on the far side is incident on the optical transmitter-receiver module of the other party of communication. Assuming that the optical transmitter-receiver module of the other party of communication has the same construction (for which the same reference numerals will be used in the following description), the transmission signal light first reaches the opposite surface 211a (shown in FIG. 30) of the partition plate 211. However, since this opposite surface 211a is coated with a photoabsorption material (black paint containing carbon or the like), no reflection light is generated here.

Subsequently, the transmission signal light incident on the reception prism lens 504 has its optical path changed and is condensed by a reception lens 517 formed on the surface of the light-receiving device 502 to enter a PD 515 that serves as a light-receiving device.

The incident light is partially reflected on this PD 515. However, because the incident light was obliquely incident on the PD 515, the light is reflected in the opposite oblique direction and does not return to the transmission prism lens 504. Subsequently, the light incident on the PD 515 is photoelectrically converted into an electric signal, amplified by a reception amplification electric circuit board 510 on which an amplification IC 513 is mounted, and taken out as a reception signal through the external input/output terminal 25 (shown in FIG. 4) to the outside of the optical transmitter-receiver module.

This optical transmitter-receiver system suppresses the electrical crosstalk by using the shield plates and suppresses the optical crosstalk by using the partition plate unit 506 that has the partition plate opposite to the optical fiber end surface with interposition of a small gap. Therefore, optical transmission by the full-duplex communication scheme is achieved. Moreover, because the gap is provided between the partition plate and the optical fiber end surface, no damage due to the rotation of the optical plug 240 occurs on the optical fiber end surface and the partition plate.

The processes of assembling the light-emitting element drive electric circuit board, the light-receiving element amplification electric circuit board and the armor shield will be described next.

Figure 31:
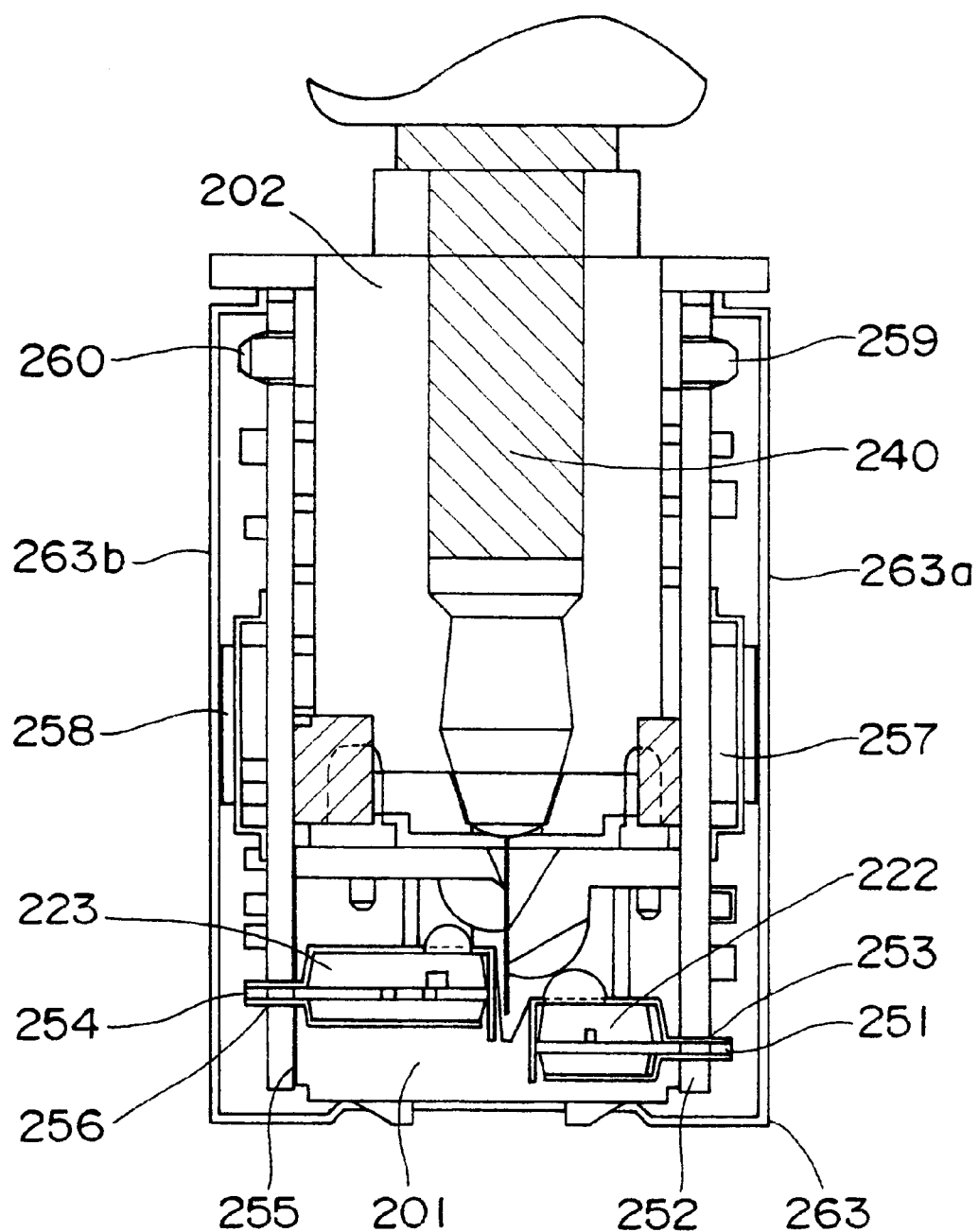
FIG. 31 is a sectional view of an optical transmitter-receiver module in which an optical plug is inserted in a jack section.

FIG. 31 is a sectional view of the optical transmitter-receiver module where the optical plug 240 is inserted in the jack section 202. In FIG. 31, lead terminals 251 of the light-emitting device 222 of the light emitting/receiving unit 201 are inserted into connection holes 253 provided at the light-emitting element drive electric circuit board 252, and electrically connected by soldering. Likewise, lead terminals 254 of the light-receiving device 223 of the light emitting/receiving unit 201 are inserted into connection holes 256 provided at the light-receiving element amplification electric circuit board 255, and electrically connected by soldering.

Figure 32A:
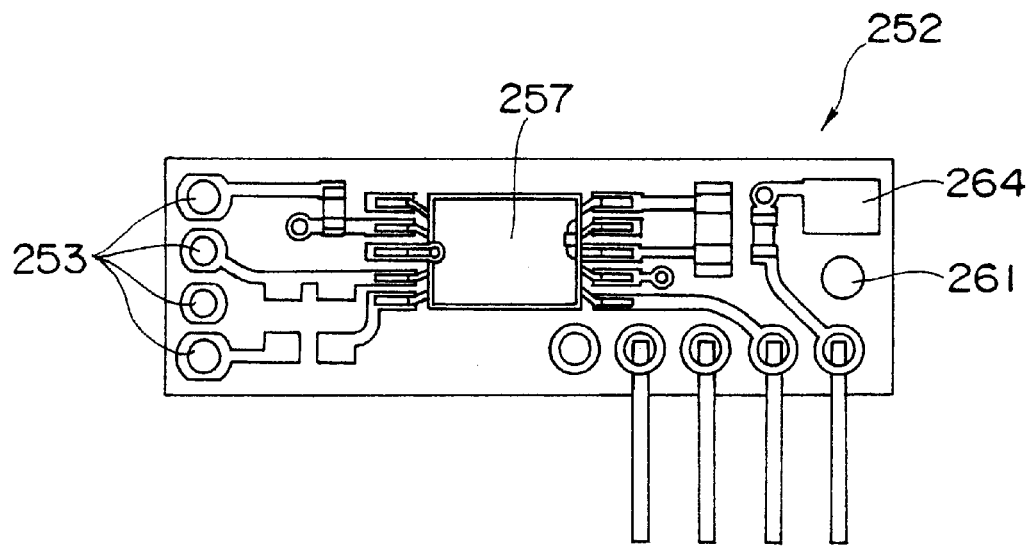
FIG. 32A is a plan view of a light-emitting element drive circuit board.
Figure 32B:
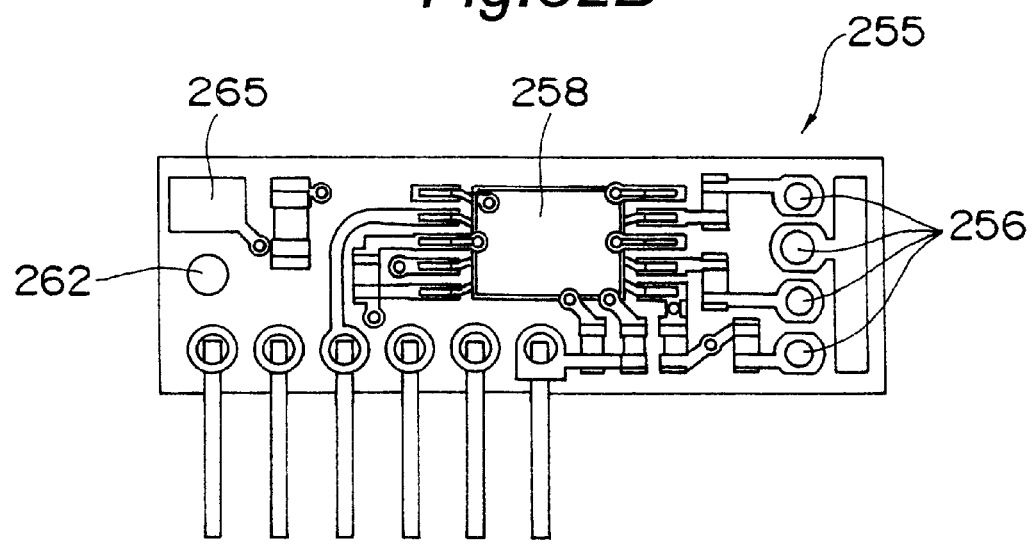
FIG. 32B is a plan view of a light-receiving element amplification electric circuit board.

FIG. 32A is a plan view of the light-emitting element drive circuit board 252. FIG. 32B is a plan view of the light-receiving element amplification electric circuit board 255. As shown in FIGS. 32A and 32B, the light-emitting element drive circuit board 252, on which the light-emitting device driver IC 257 is mounted, is generally flat in its height direction. The light-receiving element amplification electric circuit board 255, on which the reception amplification IC 258 is mounted, is also generally flat in its height direction. The light-emitting element drive circuit board 252 and the light-receiving element amplification electric circuit board 255 are assembled so that their rear surfaces oppose to each other with the interposition of the assembly 1 (combination of three parts of the light emitting/receiving unit 201, the partition plate unit 221 and the jack section 202) therebetween, centering on the optical plug 240. An assembly 2 is thereby produced. More specifically, the light-emitting element drive circuit board 252 and the light-receiving element amplification electric circuit board 255 are arranged so that the longer sides of each board are parallel to the axis of the plug 240 and the shorter sides extend along the direction of height of the jack section 202. As described above, the light-emitting element drive circuit board 252 and the light-receiving element amplification electric circuit board 255 are each arranged in an upright posture between the light-emitting device 222 (shown in FIG. 31) and the light-receiving device 223 and the plug insertion hole side of the jack section 202 so that the area of projection becomes minimized, i.e., so that the height direction of the flat light-emitting element drive circuit board 252 and the light-receiving element amplification electric circuit board 255 corresponds to the widthwise direction of the jack section 202. With this arrangement, the length of the optical transmitter-receiver module (i.e., the size in the axial direction of the optical plug 240) and the width of the optical transmitter-receiver module (i.e., the size in the direction perpendicular to the axis of the optical plug 240) are reduced, by which the downsizing of the optical transmitter-receiver module is achieved. The light-emitting element drive circuit board 252 and the light-receiving element amplification electric circuit board 255 are provided with boss pin holes 261 and 262 in which the board fixing and positioning boss pins 259 and 260 (shown in FIG. 31) provided for the jack section 202 are respectively inserted. The positioning and fixation of the light-emitting element drive circuit board 252 is achieved by first inserting the lead terminals 251 (shown in FIG. 31) of the light-emitting device 222 into the corresponding holes 253 provided at one end of the board and then soldering, and then inserting the board fixing and positioning boss pin 259 (shown in FIG. 31) of the jack section 202 into the boss pin hole 261 provided at the other end of the board. Furthermore, the positioning and fixation of the light-receiving element-amplification electric circuit board 255 is achieved by inserting the lead terminals 254 (shown in FIG. 31) of the light-receiving device 223 into the holes 256 provided at one end of the board and then soldering, and further inserting the board fixing and positioning boss pin 260 of the jack section 202 into the boss pin hole 262 provided at the other end of the board.

Then, referring to FIG. 31, an armor shield plate 263 is mounted on an assembly 2 (the light emitting/receiving unit provided with the light-receiving and -emitting boards and the jack) in order neither to receive the influence of external noises nor to let noises go outside. The armor shield plate 263 is fixed by inserting engagement portions of the armor shield plate 263 into the corresponding shield plate retaining rectangular holes 26 (shown in FIG. 3) provided in four places of the jack section 202 and then soldering the armor shield plate onto a pattern 264 and 265 (shown in FIG. 32) provided on the light-emitting element drive circuit board 252 and the light-receiving element amplification electric circuit board 255 respectively to serve as a grounding portion. By grounding the soldering portions (patterns 264 and 265) of the light-emitting element drive circuit board 252 and the light-receiving element amplification electric circuit board 255, the armor shield plate 263 can be grounded, obviating the need for separately providing a grounding terminal to the armor shield plate 263. Although this embodiment employs the armor shield plate 263 of which the light-emitting side 263a and the light-receiving side 263b are integrated with each other, it is acceptable to employ an armor shield plate divided into two parts. It is also acceptable to separately provide a grounding terminal for the armor shield plate 263.

The boss pin hole 261 that serves as a first hole provided at one end of the light-emitting element drive circuit board 252, the board fixing and positioning boss pin 259 that serves as a projection provided for the jack section 202, the connection holes 253 that serve as second holes provided at the opposite end of the light-emitting element drive circuit board 252, and the lead terminals 251 of the light emitting/receiving unit 201, all together, constitute a board positioning means. Moreover, the boss pin hole 262 that serves as a first hole provided at one end of the light-receiving element amplification electric circuit board 255, the board fixing and positioning boss pin 260 that serves as a projection provided at the jack section 202, the connection holes 256 that serve as second holes provided at the opposite end of the light-receiving element amplification electric circuit board 255, and the lead terminals 254 of the light emitting/receiving unit 201, all together, constitute a board positioning means.

In the present embodiment, the positioning and fixation are performed by inserting the projections provided at the transmission prism lens and the reception prism lens into the holes provided at the light emitting/receiving unit. However, it is acceptable to perform the positioning and fixation by providing holes at the transmission prism lens and the reception prism lens, providing projections at the optical light emitting/receiving unit and inserting the projections of the optical light emitting/receiving unit into the holes of the prism lenses.

Furthermore, in the present embodiment, the light emitting/receiving unit is prevented from detaching from the jack section by providing hooks at the jack section, providing grooves at the light emitting/receiving unit and fitting the hooks of the jack section in the grooves of the light emitting/receiving unit. However, it is acceptable to prevent the light emitting/receiving unit from the detachment by providing a groove at the jack section, providing a hook at the light emitting/receiving unit and fitting the hook of the light emitting/receiving unit into the groove of the jack section.

The optical transmitter-receiver module of this invention is applicable to electronic equipment such as a digital TV set, a digital BS tuner, a CS tuner, a DVD player, a SuperAudio CD player, an AV amplifier, an audio device, a personal computer, personal computer peripherals, a mobile phone, a PDA (personal data assistant) and the like.

Figure 33:
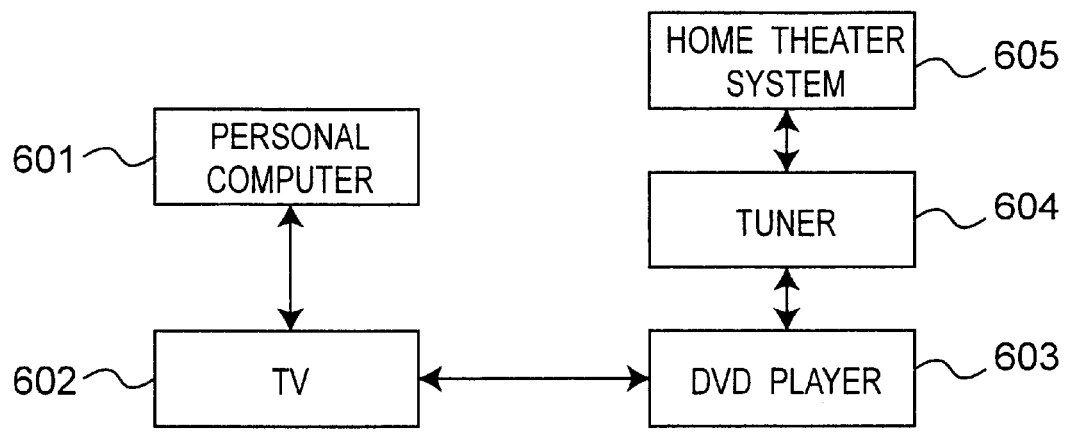
FIG. 33 is a block diagram schematically showing an optical transmitter-receiver system in which the optical transmitter-receiver module of this invention is employed.

For example, as shown in FIG. 33, it is possible to serially connect, using a single-core optical fiber cable, a personal computer 601, a television set 602, a DVD player 603, a tuner 604 and a home theater system 605, these devices employing the optical module of the present invention, to thereby construct an optical transmitter-receiver system for performing bidirectional optical transmission between the devices by the full-duplex communication scheme.

Figure 34:
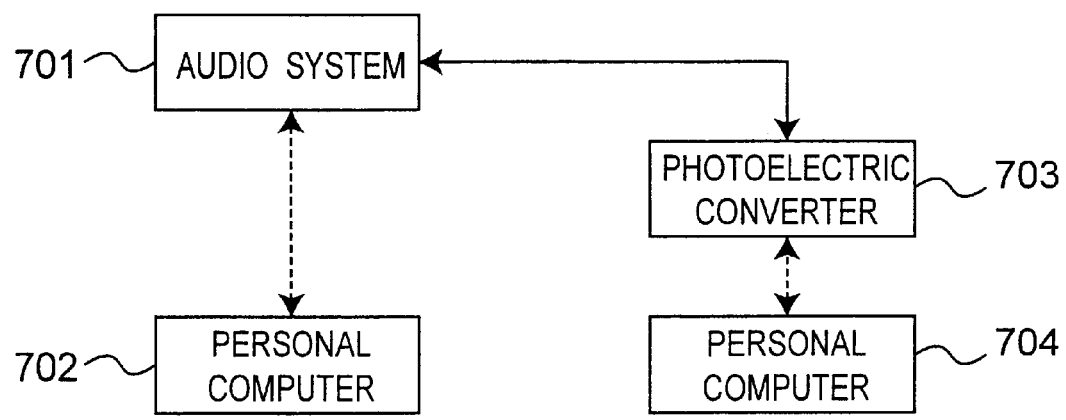
FIG. 34 is a block diagram schematically showing another optical transmitter-receiver system in which the optical transmitter-receiver module of this invention is employed.
Figure 35A:
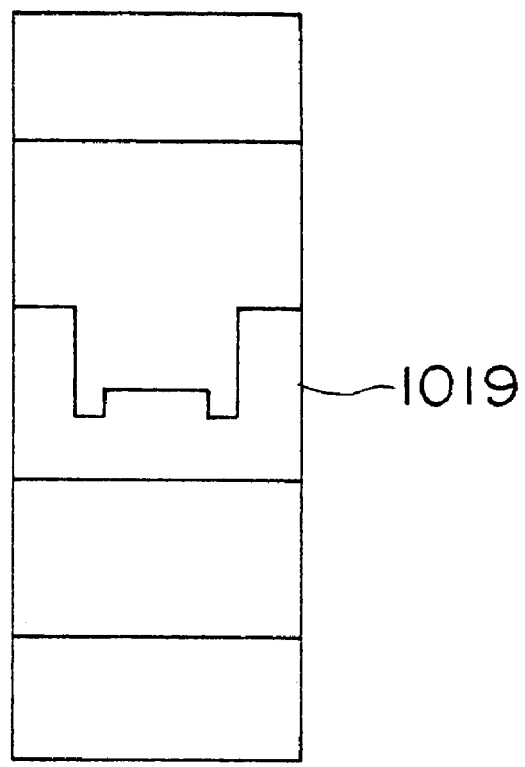
FIG. 35A is a plan view of a partition plate of the first conventional optical transmitter-receiver module.
Figure 35B:
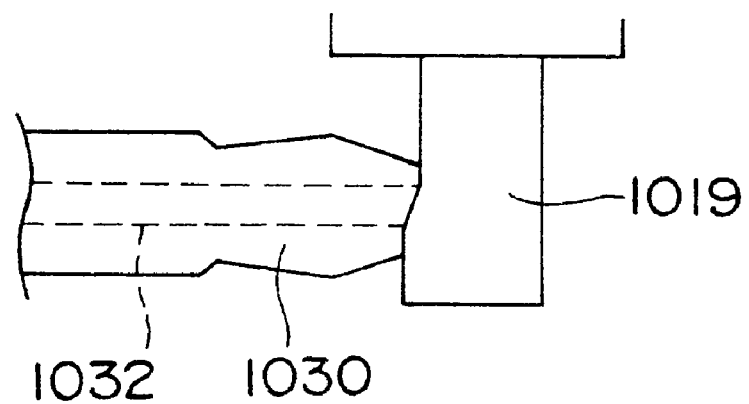
FIG. 35B is a side view showing the positional relationship of the partition plate with respect to an optical plug.
Figure 36A:
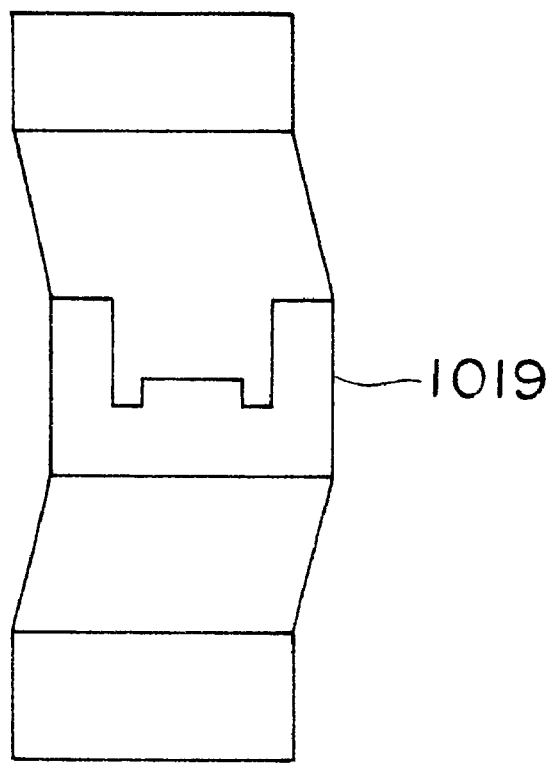
FIG. 36A is a plan view of the partition plate of the above optical transmitter-receiver module.
Figure 36B:
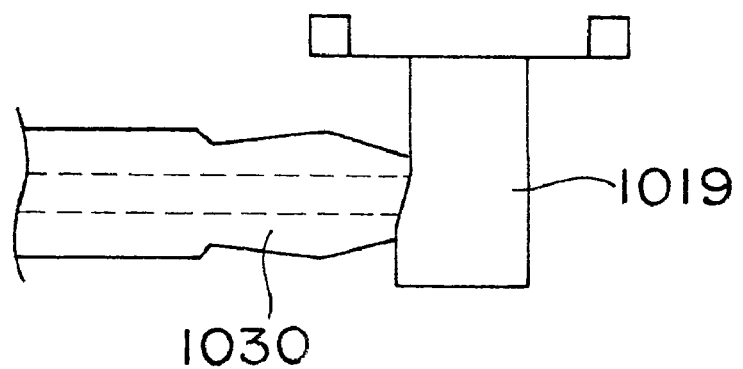
FIG. 36B is a side view showing the positional relationship of the partition plate with respect to the optical plug.
Figure 37A:
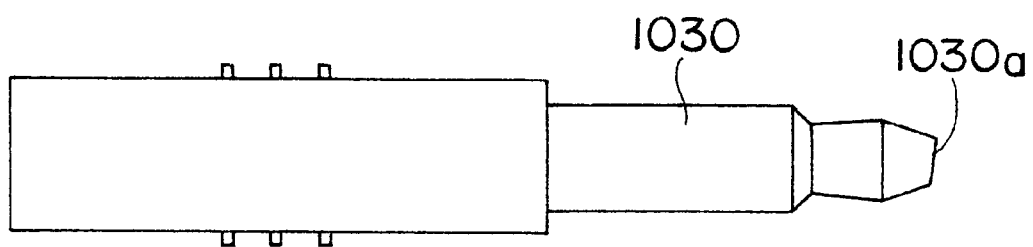
FIG. 37A is a side view showing an essential part of an optical cable that has an optical plug and constitutes an optical transmitter-receiver system with the above optical transmitter-receiver module.
Figure 37B:
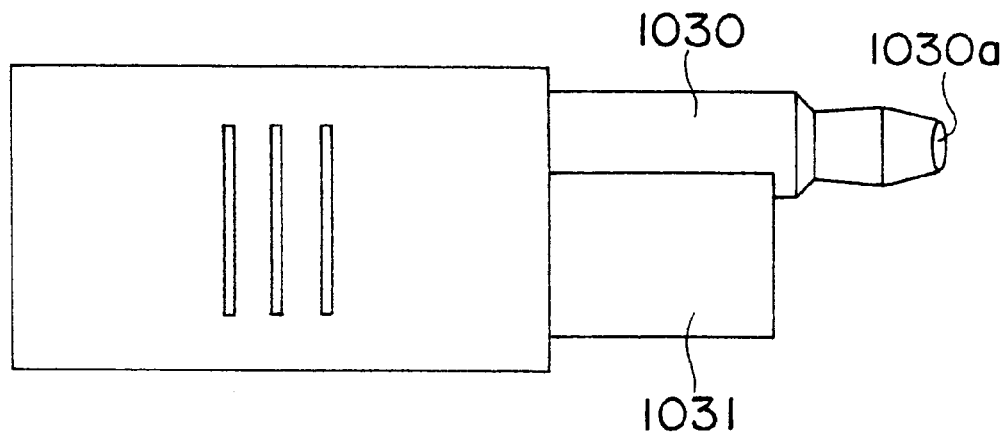
FIG. 37B is a rear view of the optical cable that has the optical plug.
Figure 38:
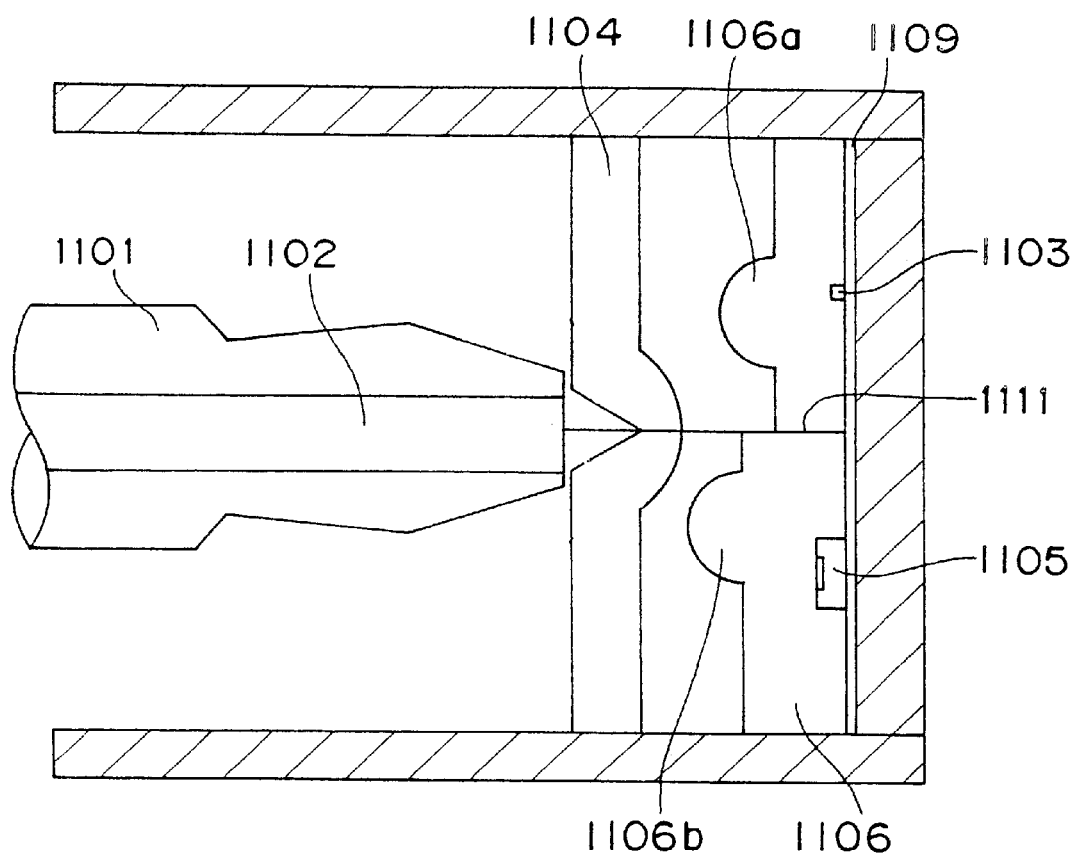
FIG. 38 is a sectional view of the second conventional optical transmitter-receiver module.

Referring to FIG. 34, if an audio system 701 and a personal computer 702 are connected with each other via an electric communication interface of IEEE1394 or the like, then noises generated from the personal computer 702 exert bad influence on the audio system 701. To avoid this, the audio system 701 may be connected with a personal computer 704 via a photoelectric converter 703. In this case, an optical transmitter-receiver system for performing bidirectional optical transmission by the full-duplex communication scheme using the optical transmitter-receiver module of this invention may be realized by connecting the personal computer 704 with the photoelectric converter 703 via an electric communication interface and connecting the photoelectric converter 703 with the audio system 701 via a single-core optical fiber cable.

Although the LED is employed as a light-emitting element in the embodiment, it is acceptable to employ a semiconductor laser element as the light-emitting element.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical transmitter-receiver module having a light-emitting element for emitting transmission signal light and a light-receiving element for receiving reception signal light, said module being able to perform both transmission of the transmission signal light and reception of the reception signal light by means of a single-core optical fiber, said module comprising:

a jack section for detachably holding an optical plug provided at an end portion of the optical fiber;

a light emitting/receiving unit having the light-emitting element and light-receiving element positioned and fixed in place and molded in one piece; and a light-tight partition plate unit for separating an optical path of the transmission signal light and an optical path of the reception signal light from each other, said light-tight partition plate being arranged so as to be held between the jack section and the light emitting/receiving unit, the light-tight partition plate unit having spring means for urging this unit toward the optical fiber.

2. The optical transmitter-receiver module as claimed in claim 1, wherein the partition plate unit has a partition plate for separating an optical path of the transmission signal light and an optical path of the reception signal light from each other, a resin-molded piece having an engagement surface with which an end surface of the optical plug comes in contact when inserted in the jack section, and the spring means urging the engagement surface of the resin-molded piece toward the optical plug, and the module further comprises a retaining portion for retaining the partition plate unit movably in a direction of optical axis of the optical fiber.

3. The optical transmitter-receiver module as claimed in claim 2, wherein the spring means of the partition plate unit are provided in at least two places located on a plane approximately perpendicular to the optical axis of the fiber and on a diagonal line of the resin molding.

4. The optical transmitter-receiver module as claimed in claim 2, wherein the partition plate and resin-molded piece of the partition plate unit are formed into one piece by insert molding.

5. The optical transmitter-receiver module as claimed in claim 2, wherein the partition plate of the partition plate unit has a planar opposed surface that faces an end surface of the optical fiber with a gap therebetween when the optical plug is placed in position within the module.

6. The optical transmitter-receiver module as claimed in claim 5, wherein an optical absorption layer is provided on the opposite surface of the partition plate.

7. The optical transmitter-receiver module as claimed in claim 2, wherein said engagement surface of the resin-molded piece comes in contact with a peripheral edge portion of the end surface of the optical plug.

8. The optical transmitter-receiver module as claimed in claim 2, wherein the partition plate is sized such that a distance in a direction of optical axis from said end surface of the optical fiber to an end opposite from the optical fiber of the partition plate is greater than distances in a direction of optical axis from said end surface of the optical fiber to each of a bottom of a transmission lens provided on emission side of the light-emitting element and a bottom of a reception lens provided on incident side of the light-receiving element.

9. An electronic device employing the optical transmitter-receiver module as claimed in claim 1.

* * * * *